(12) United States Patent  
Murakami et al.

(10) Patent No.: US 11,974,380 B2  
(45) Date of Patent: Apr. 30, 2024

(54) AUTOMOTIVE LAMP

(71) Applicant: KOITO MANUFACTURING CO., LTD., Tokyo (JP)

(72) Inventors: Kentarou Murakami, Shizuoka (JP); Atsushi Uesugi, Shizuoka (JP); Toshiyuki Tsuchiya, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 222 days.

(21) Appl. No.: 17/547,756

(22) Filed: Dec. 10, 2021

(65) Prior Publication Data

US 2022/0104330 A1 Mar. 31, 2022

Related U.S. Application Data

(63) Continuation of application No. PCT/JP2020/022853, filed on Jun. 10, 2020.

(30) Foreign Application Priority Data

Jun. 12, 2019 (JP) ................... 2019-109761  
Jun. 12, 2019 (JP) ................... 2019-109762  
Jun. 28, 2019 (JP) ................... 2019-122036

(51) Int. Cl.  
*F21S 41/00* (2018.01)  
*B60Q 1/076* (2006.01)  
(Continued)

(52) U.S. Cl.  
CPC ............. *H05B 47/16* (2020.01); *B60Q 1/076* (2013.01); *F21S 41/14* (2018.01); *F21S 41/675* (2018.01); *H03K 17/78* (2013.01)

(58) Field of Classification Search  
CPC . B60Q 1/04; B60Q 1/14; B60Q 1/076; H04B 47/16; F21S 41/14; F21S 41/675; H03K 17/78  
See application file for complete search history.

(56) References Cited

U.S. PATENT DOCUMENTS

2007/0082577 A1 4/2007 Tajima  
2008/0203946 A1 8/2008 Ito et al.  
(Continued)

FOREIGN PATENT DOCUMENTS

JP 2007128856 A 5/2007  
JP 2008205357 A 9/2008  
(Continued)

OTHER PUBLICATIONS

International Search Report (PCT/ISA/210) with translation and Written Opinion (PCT/ISA/237) dated Aug. 18, 2020, by the Japan Patent Office as the International Searching Authority for International Application No. PCT/JP2020/022853. (23 pages).

*Primary Examiner* — Tuan T Lam  
(74) *Attorney, Agent, or Firm* — BUCHANAN INGERSOLL & ROONEY PC

(57) ABSTRACT

A scanning light source includes a semiconductor light source and a motor, and scans output light of the semiconductor light source in front of a lamp according to the movement of the motor. A constant current driver supplies a driving current $I_{LED}$ to the semiconductor light source according to a light source control signal. A light source control signal generator generates the light source control signal so as to obtain a light distribution pattern that corresponds to light distribution instruction data. A delay time measurement device measures the delay time required for the transition of the on/off states of the semiconductor light source from the change of the light source control signal.

5 Claims, 21 Drawing Sheets

(51) Int. Cl.
*F21S 41/14* (2018.01)
*F21S 41/675* (2018.01)
*H05B 47/16* (2020.01)
*H03K 17/78* (2006.01)

(56) References Cited

U.S. PATENT DOCUMENTS

| | | | |
|---|---|---|---|
| 2011/0110002 A1 | 5/2011 | Ooshima | |
| 2014/0042325 A1 | 2/2014 | Yamamura | |
| 2017/0282786 A1* | 10/2017 | Toda | F21S 41/148 |
| 2018/0043820 A1 | 2/2018 | Murakami et al. | |
| 2018/0372295 A1* | 12/2018 | Kikuchi | F21S 41/153 |
| 2023/0322153 A1* | 10/2023 | Kamiya | F21S 41/675 |
| | | | 315/82 |

FOREIGN PATENT DOCUMENTS

| | | |
|---|---|---|
| JP | 2009171728 A | 7/2009 |
| JP | 2010006109 A | 1/2010 |
| JP | 2010035312 A | 2/2010 |
| JP | 2012224317 A | 11/2012 |
| JP | 2019081422 A | 5/2019 |
| WO | 2016104319 A1 | 6/2016 |
| WO | 2016167250 A1 | 10/2016 |

\* cited by examiner

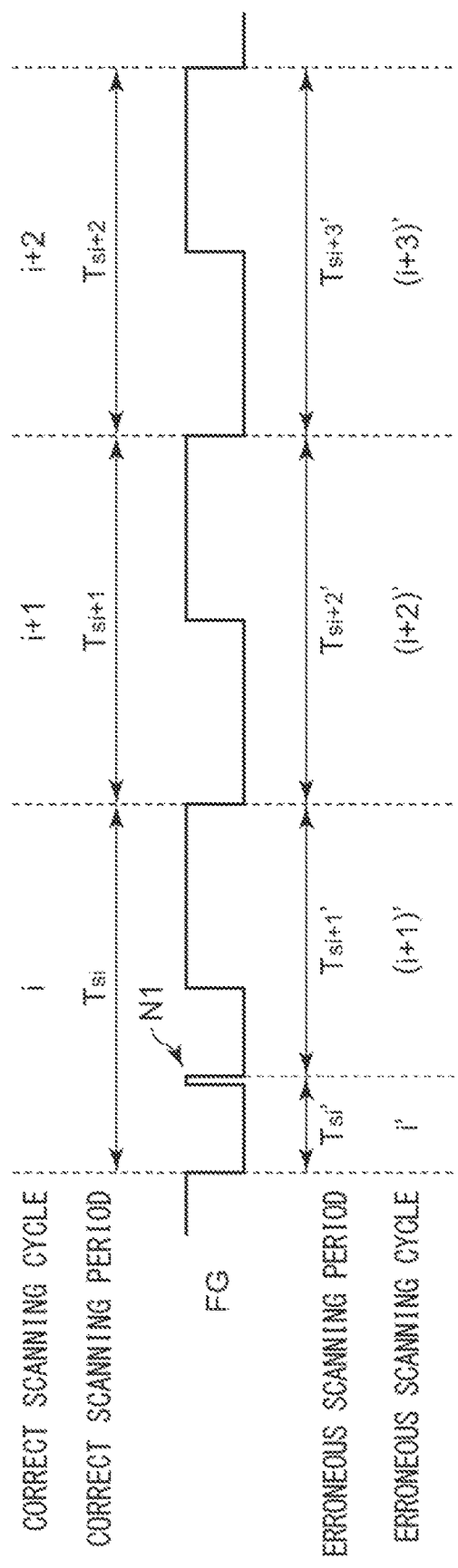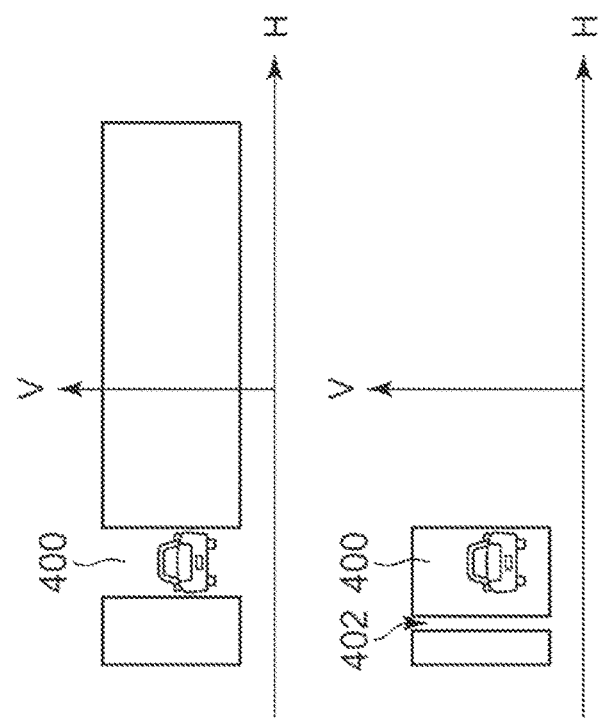
FIG. 6A
FIG. 6B
LIGHT DISTRIBUTION PATTERN
FIG. 6C
LIGHT DISTRIBUTION PATTERN

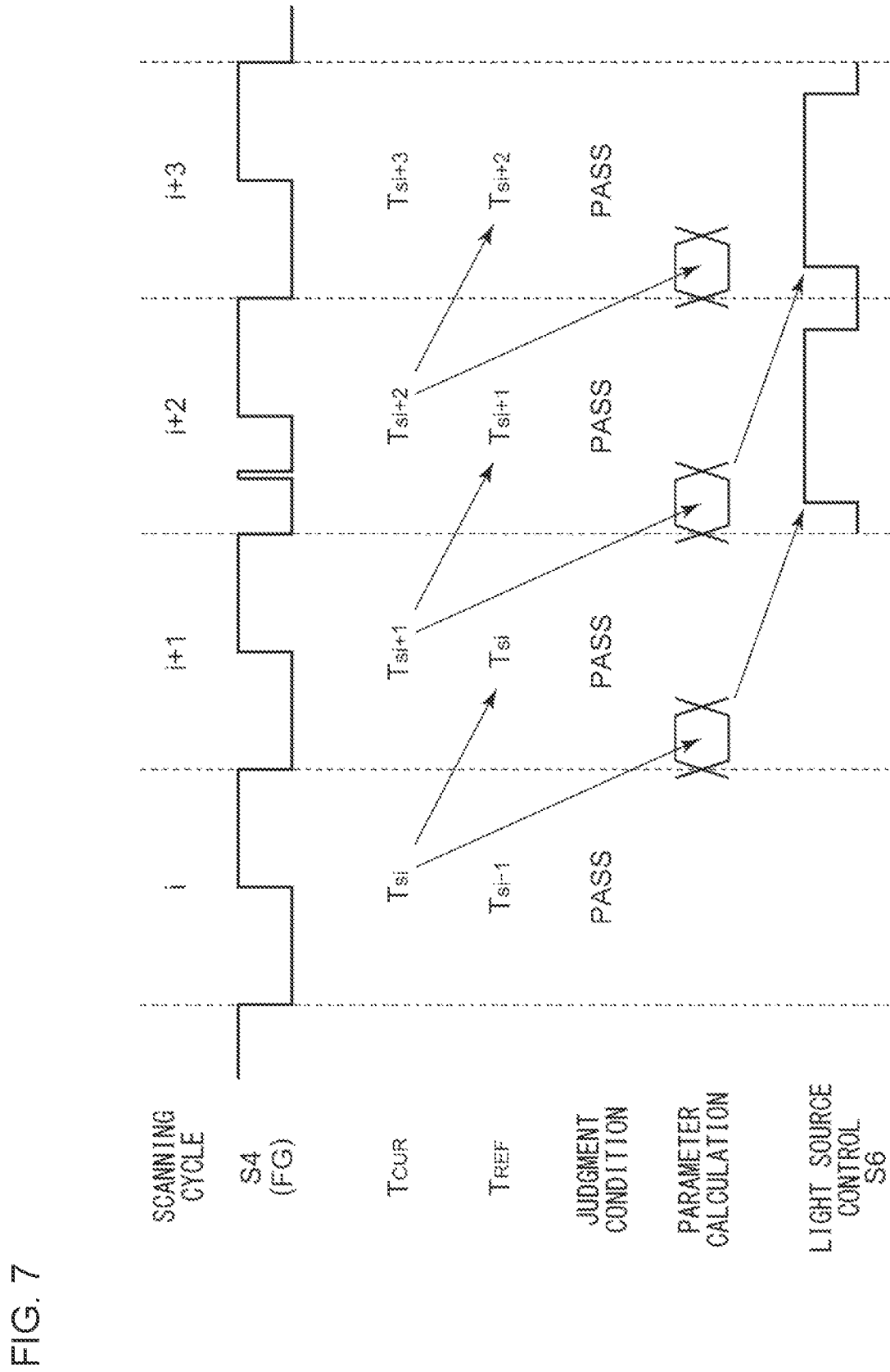

FIG. 14
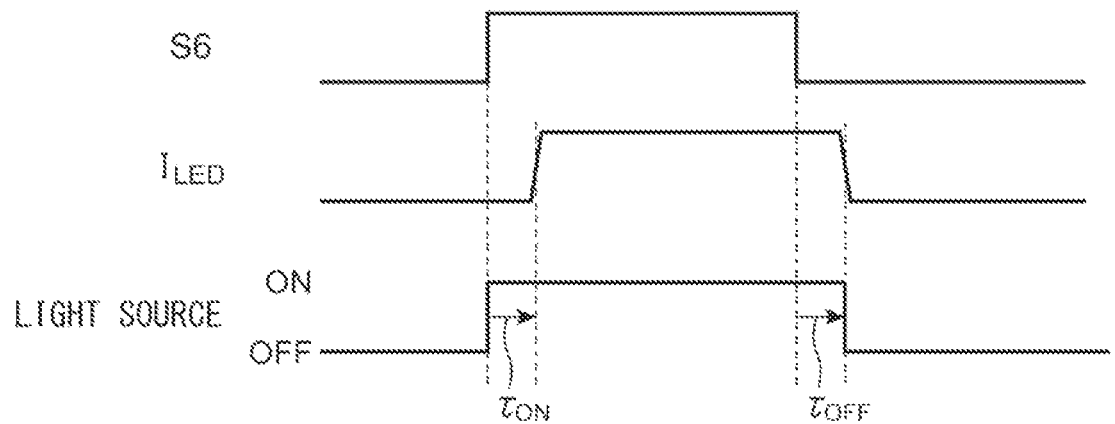
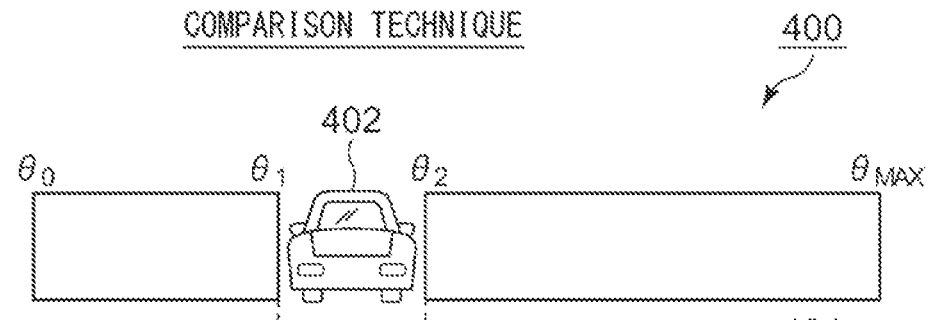
FIG. 15A
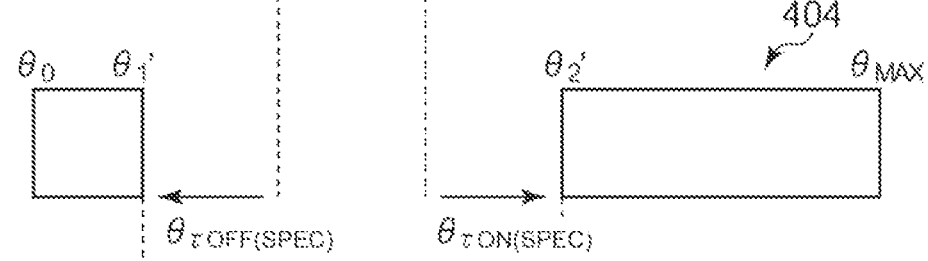
FIG. 15B
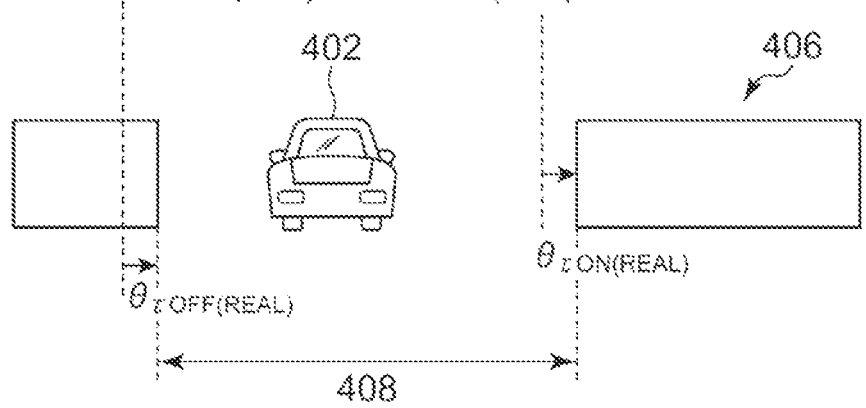
FIG. 15C

AUTOMOTIVE LAMP

BACKGROUND

1. Technical Field

The present disclosure relates to an automotive lamp employed in an automobile or the like.

2. Description of the Related Art

Typical automotive lamps are capable of switching between a low-beam mode and a high-beam mode. The low-beam mode is used to illuminate a close range in the vicinity of the user's vehicle with a predetermined light intensity. In the low-beam mode, light distribution is determined so as to prevent glare being imparted to an oncoming vehicle or a leading vehicle. The low-beam mode is mainly used when the vehicle is traveling in an urban area. In contrast, the high-beam mode is used to illuminate a distant range over a wide area ahead of the vehicle with a relatively high light intensity. The high-beam mode is mainly used when the vehicle is traveling at high speed along a road where there are a small number of oncoming vehicles and leading vehicles. Accordingly, the high-beam mode provides the driver with high visibility, which is an advantage, as compared with the low-beam mode. However, the high-beam mode has a problem of imparting glare to a pedestrian or a driver of a vehicle ahead of the vehicle.

In recent years, the Adaptive Driving Beam (ADB) technique has been proposed in which a high-beam distribution pattern is dynamically and adaptively controlled based on the state of the surroundings of a vehicle. With the ADB technique, the presence or absence of a leading vehicle, an oncoming vehicle, or a pedestrian ahead of the vehicle is detected, and the illumination is reduced for a region that corresponds to such a vehicle or pedestrian thus detected, thereby reducing glare imparted to such a vehicle or pedestrian.

As a method for providing the ADB function, various methods have been proposed, such as a shutter method in which an actuator is controlled, a rotary method, an LED array method, and so forth. With the shutter method or the rotary method, this allows a lighting off region (shielded region) to have a continuously variable width. However, the number of the lighting off regions is limited to only one. The LED array method allows a multiple number of lighting off regions to be designed. However, the width of each lighting off region is limited depending on the illumination width of each LED chip. Thus, the LED array method leads to discrete lighting off regions, which is a problem.

In order to solve these problems, the present applicant has proposed a scanning method as an ADB method (see Patent documents 2 through 4). In the scanning method, light is input to a rotated reflector (blade), and the input light is reflected with an angle that corresponds to the rotational position of the reflector. Furthermore, the lighting on/off of a light source or the luminance is changed according to the rotational position of the reflector while scanning the reflected light to a forward region in front of the vehicle, so as to form a desired light distribution pattern in front of the vehicle.

RELATED ART DOCUMENTS

Patent Documents

[Patent Document 1]
 Japanese Patent Application Laid Open No. 2008-205357
[Patent Document 2]
 Japanese Patent Application Laid Open No. 2012-224317
[Patent Document 3]
 Japanese Patent Application Laid Open No. 2010-6109
[Patent Document 4]
 PCT Japanese Translation Patent Publication No. WO2016/167250

Problem 1. Such an arrangement involves an unintended or intended delay until the light source actually turns on (turns off) after a lighting-on instruction (lighting-off instruction) is issued. Also, variation or fluctuation occurs in the delay amount due to individual circuit variation or temperature fluctuation, power supply voltage fluctuation, and so on. Such variation or fluctuation of the delay amount leads to a shift in the lighting-on timing (or lighting-off timing). This results in a situation in which a beam is irradiated to a region to which the beam is not to be irradiated, or a situation in which a beam is not irradiated to a region to which the beam is to be irradiated. That is to say, this leads to degradation in the accuracy of the light distribution pattern.

Problem 2. In order to control the on/off states the light source or the luminance of emitted light in synchronization with the rotational position of the reflector, a scanning period is required. The scanning period can be acquired by measuring the period of a pulse signal that is synchronized with the rotation of a motor. However, if noise contamination occurs in the pulse signal, the scanning period is measured erroneously. In a case in which the light source is controlled based on the erroneous scanning period, this has the potential to irradiate a beam to a region to be shielded, leading to a potential problem of imparting glare to traffic participants positioned in this region. Conversely, since a region to which a beam is to be irradiated is shielded, this leads to a dark region in front of the vehicle, resulting in degraded visibility in front of the vehicle.

Problem 3. In order to rotate the reflector, a motor and a motor driver configured to drive the motor with a predetermined rotational speed are provided. If foreign matter is caught in the motor or interferes with the motor, the motor enters a lock state in which the motor is not able to rotate even when a torque is generated by supplying a driving current to the motor. If the supply of a driving current is continued in the lock state, this leads to abnormal generation of heat in the motor and the motor driver, resulting in adverse effects on reliability.

SUMMARY

An embodiment of the present invention has been made in order to solve the problem 1. Accordingly, it is an exemplary purpose of the embodiment of the present invention to provide a lighting circuit with improved accuracy of a light distribution pattern.

An embodiment of the present invention has been made in order to solve the problem 2. Accordingly, it is an exemplary purpose of the embodiment of the present invention to provide a scanning-type automotive lamp with a reduced effect of noise superimposed on a pulse signal to be used for position detection.

An embodiment of the present invention has been made in order to solve the problem 3. Accordingly, it is an exemplary purpose of the embodiment of the present invention to provide an automotive lamp provided with a lock protection function.

Description will be made regarding an outline of several example embodiments of the present disclosure. In this outline, some concepts of one or more embodiments will be described in a simplified form as a prelude to the more detailed description that is presented later in order to provide a basic understanding of such embodiments. Accordingly, the outline is by no means intended to restrict the scope of the present invention or the present disclosure. Furthermore, this outline is not an extensive overview of all conceivable embodiments, and is by no means intended to restrict essential elements of the embodiments. For convenience, the term "one embodiment" may be used herein to refer to a single embodiment or multiple embodiments disclosed in the present specification.

1. A lighting circuit according to one embodiment controls a scanning light source that includes a semiconductor light source and a motor, and that is structured to scan output light of the semiconductor light source in front of a lamp according to the movement of the motor. The lighting circuit includes: a constant current driver structured to supply a driving current that corresponds to a light source control signal to the semiconductor light source; a light source control signal generator structured to generate the light source control signal so as to obtain a light distribution pattern that corresponds to light distribution instruction data; and a delay time measurement device structured to measure a delay time required for the transition of lighting-on and lighting-off states of the semiconductor light source from the change of the light source control signal. The lighting circuit cancels variation and fluctuation of the delay time.

2. An automotive lamp according to one embodiment includes a scanning light source and a lighting circuit. The scanning light source includes a semiconductor light source and a motor, and is structured to scan output light of the semiconductor light source in front of the lamp according to the movement of the motor. The lighting circuit is structured to measure the period of a pulse signal that is synchronized with the movement of the motor, to calculate a parameter based on a measurement value of the period and light distribution instruction data, to generate a dimming signal for indicating the time waveform of the light amount to be output from the semiconductor light source using the parameter, and to turn on the semiconductor light source according to the dimming signal. In the lighting circuit, a judgement condition is defined with respect to a current value that is the measurement value of the period in a current cycle and a reference value that is a period that was used to calculate the parameter in the immediately previous cycle. When pass judgement has been made for the judgment condition, the current value is used to calculate the parameter. When fail judgement has been made for the judgment condition, instead of the current value, the reference value is used to calculate the parameter.

3. An automotive lamp according to one embodiment includes a scanning light source and a lighting circuit. The scanning light source includes a motor and a motor driver structured to rotate the motor in an enable state, and to stop the rotation of the motor in a disable state. The lighting circuit is structured to supply an enable signal for indicating an enable state and a disable state driver to the motor driver, and to turn on the semiconductor light source in synchronization with a pulse-shaped position detection signal that is synchronized with the rotation of the motor so as to obtain a desired light distribution pattern. When an event which is a trigger for starting the rotation of the motor occurs, the lighting circuit asserts the enable signal. After the assertion of the enable signal, when the lighting circuit detects that a state in which the period of the position detection signal is longer than a predetermined threshold value continues for a predetermined first time, the lighting circuit repeats a retry operation in which the enable signal is negated, following which, after a predetermined second time elapses, the enable signal is asserted again. When the period of the position detection signal does not become shorter than the threshold value even after the retry operation is executed multiple times, the lighting circuit makes an abnormal stop in a state in which the enable signal is negated.

It should be noted that any combination of the components described above or any manifestation thereof may be mutually substituted between a method, apparatus, system, and so forth, which are also effective as an embodiment of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIGS. 6A through 6C are diagrams for explaining the effects of noise on an FG signal;

FIG. 7 is a diagram for explaining the calculation of a parameter based on a relation between a reference value $T_{REF}$ and a current value $T_{CUR}$;

FIG. 14 is a diagram for explaining a control delay that occurs in a semiconductor light source;

FIGS. 15A through 15C are diagrams for explaining comparison techniques;

DETAILED DESCRIPTION

Figure 1:
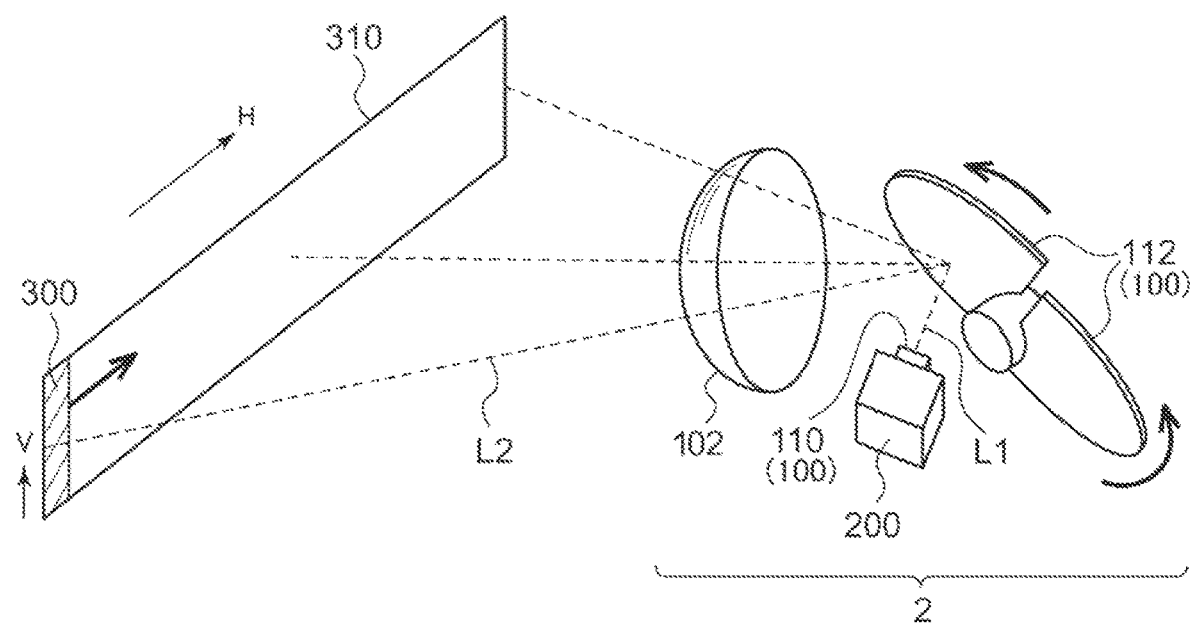
FIG. 1 is a perspective view showing a schematic configuration of an automotive lamp according to an embodiment.

Description will be made below regarding the present invention based on preferred embodiments with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

In the present specification, the state represented by the phrase "the member A is coupled to the member B" includes a state in which the member A is indirectly coupled to the member B via another member that does not substantially affect the electric connection between them, or that does not damage the functions or effects of the connection between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C via another member that does not substantially affect the electric connection between them, or that does not damage the functions or effects of the connection between them, in addition to a state in which they are directly coupled.

FIG. 1 is a perspective view showing a schematic configuration of an automotive lamp 2. The automotive lamp 2 shown in FIG. 1 has an ADB function employing a scanning method. The automotive lamp 2 forms various kinds of light distribution patterns (high beam) in front of the vehicle. Also, the automotive lamp 2 is configured to turn on due to a passing operation. The automotive lamp 2 mainly includes a scanning light source 100, a projector lens 102, and a lighting circuit 200.

A scanning light source 100 includes a semiconductor light source 110, and scans the output light of the semiconductor light source 110 in front of the vehicle. Multiple semiconductor light sources 110 may be provided. However, for ease of understanding and simplification of description, description will be made regarding an arrangement including a single semiconductor light source 110. As the semiconductor light source 110, a semiconductor light source such as an LED (light-emitting diode), laser diode, or the like may be employed. The scanning light source 100 includes a blade (reflector) 112 in addition to the semiconductor light source 110. The blade 112 receives the output light L1 of the semiconductor light source 110, and repeats a predetermined periodic movement so as to scan the reflected light L2 thereof in front of the vehicle in the horizontal direction (H direction in the drawing). With the present embodiment, the blade 112 is attached to a rotor of an unshown motor, and is rotationally driven. At a given time point, the incident light L1 on the blade 112 is reflected with a reflection angle that corresponds to the position (rotational angle of the rotor) of the blade 112, which forms a target region 300 in front of the vehicle. The target region 300 has a predetermined width in the horizontal direction (H direction) and in the vertical direction (V direction).

The blade 112 is rotationally driven, which changes the reflection angle. This scans the position of the target region 300 (scanning position) in the horizontal direction (H direction). This operation is repeated at high speed, e.g., at 50 Hz or more, so as to form a light distribution pattern 310 in front of the vehicle.

The lighting circuit 200 controls the light amount (luminance) of the semiconductor light source 110 in synchronization with the scanning of the scanning light source 100, and specifically, in synchronization with the periodic movement of the blade 112, so as to provide the given light distribution pattern 310. During the scanning, the illumination of the target region 300 is controlled at each scanning position. With this, such an arrangement forms a non-zero-illumination region (lighting-on region $R_{ON}$) and a zero-illumination region (lighting-off region $R_{OFF}$). The light distribution pattern 310 is configured as a combination of the lighting-on region $R_{ON}$ and the lighting-off region $R_{OFF}$.

Embodiment 1

Figure 2:
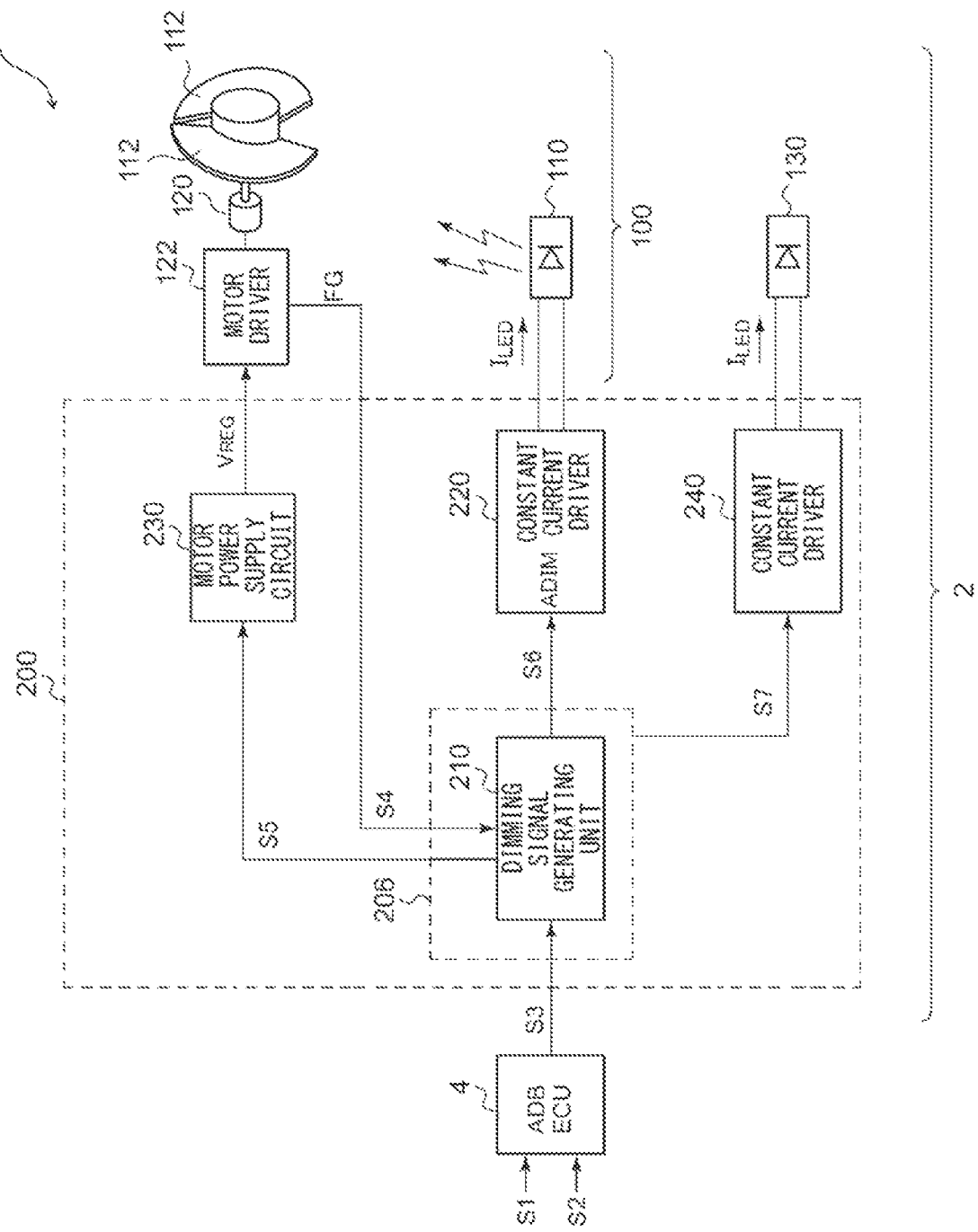
FIG. 2 is a block diagram showing a lamp system provided with an automotive lamp according to an embodiment 1.

Next, description will be made regarding a configuration of the lighting circuit 200 of the automotive lamp 2 according to an embodiment 1. FIG. 2 is a block diagram showing a lamp system 1 including an automotive lamp 2. The lamp system 1 includes an in-vehicle ECU 4 and the automotive lamp 2.

The in-vehicle ECU 4 controls the state of the automotive lamp 2. Specifically, the in-vehicle ECU 4 supplies an instruction signal S3 including lighting-on/lighting-off instructions for a high beam and low beam, light distribution of the high beam in the ADB control, a lighting-on instruction for passing, etc., to the lighting circuit 200.

With respect to the light distribution control, camera information S1 and vehicle information S2 are supplied to the in-vehicle ECU 4. The in-vehicle ECU 4 detects a situation in front of the vehicle, and specifically, the presence or absence of an oncoming vehicle, the presence or absence of a leading vehicle, the presence or absence of a pedestrian, etc., based on the camera information S1. Furthermore, the in-vehicle ECU 4 detects the current vehicle speed, current steering angle, etc., based on the vehicle information S2. The in-vehicle ECU 4 determines the light distribution pattern to be irradiated in front of the vehicle based on the information thus received. Furthermore, the in-vehicle ECU 4 transmits the instruction signal S3 including information that indicates the light distribution pattern (which will be referred to as "light distribution instruction data S3a") to the automotive lamp 2. Furthermore, when the driver executes a passing operation, the in-vehicle ECU 4 transmits the instruction signal S3 including a lighting-on instruction that corresponds to passing to the automotive lamp 2. It should be noted that the light distribution pattern generation function may be implemented as an internal function of the automotive lamp 2. For example, the light distribution pattern generation function may be implemented in an ECU of the lighting circuit 200.

The automotive lamp 2 includes the scanning light source 100 configured as a high-beam light source, a low-beam light source 130, and the lighting circuit 200.

The scanning light source 100 includes a motor 120 and a motor driver 122, in addition to the semiconductor light source 110 and the blade 112. The blade 112 is attached to the motor 120. The angle of incidence (and angle of reflection) of the output light L1 of the semiconductor light source 110 is changed according to the rotation of the motor 120. The reflected light L2 is scanned in front of the vehicle. During a period in which the power supply voltage $V_{REG}$ is supplied from the lighting circuit 200, the motor driver 122 is set to an enable state. In the enable state, the motor 120 is rotationally driven with a predetermined rotational speed. During a period in which the power supply voltage $V_{REG}$ is cut off, the motor driver 122 is set to a disable state. In the disable state, the motor driver 122 stops the supply of the driving current to the motor 120, thereby stopping the rotation of the motor 120. That is to say, the power supply voltage $V_{REG}$ functions as an enable signal for switching the enable state/disable state of the motor driver 122. In other words, a state in which the power supply voltage $V_{REG}$ is supplied corresponds to assertion, and a state in which the power supply voltage $V_{REG}$ is cut off corresponds to negation (negate, deassert).

The lighting circuit 200 controls the on/off states and the luminance of emitted light of the scanning light source 100 and the low-beam light source 130 according to the instruction signal S3 from the in-vehicle ECU 4. Furthermore, the lighting circuit 200 controls the rotation and the stopping of the motor 120.

The lighting circuit 200 includes a lamp ECU 206, a high-beam constant current driver 220, a motor power supply circuit 230, and a low-beam constant current driver 240.

The lamp ECU 206 includes a microcontroller, and integrally controls the lighting circuit 200. Upon receiving the instruction signal S3 including the lighting-on instruction for the low beam, the lamp ECU 206 asserts (sets to high level, for example) a low-beam lighting-on instruction signal S7, so as to enable the constant current driver 240. In the enable state, the constant current driver 240 supplies a driving current $I_{LED}$ to the low-beam light source 130 so as to turn on the low beam.

Description will be made below regarding control of the scanning light source 100. The lamp ECU 206 supplies a power supply control signal S5 to the motor power supply circuit 230 for instructing the generation/stopping of the power supply voltage $V_{REG}$. Accordingly, the rotation/stopping of the motor 120 is controlled based on the power supply control signal S5. In the present embodiment, after the ignition of the vehicle is turned on, the power supply control signal S5 is asserted (e.g., set to the high level) in response to the first lighting-on instruction for the semiconductor light source 110, thereby starting the rotation of the motor 120.

The lamp ECU 206 receives the input of a position detection signal S4 in addition to light distribution instruction data S3a included in the instruction signal S3. The position detection signal S4 is configured as a pulse signal that indicates the position of the blade 112, i.e., the current beam scanning position, and is configured as a rotation detection signal that is synchronized with the rotation of the motor 120. For example, the position detection signal S4 may indicate the timing at which a predetermined reference portion of the blade 112 passes through a predetermined position. For example, the reference portions may be end portions of the two blades 112 (gaps between them). Also, the reference portion may be a central portion of each blade. Also, a desired portion may be employed as the reference portion.

A Hall element may be mounted on the motor 120 that rotates the blade 112. In this case, a Hall signal output from the Hall element is configured as a signal having a periodic waveform that corresponds to the position of the rotor, i.e., the position of the blade. For example, the motor driver 122 is provided with a function for generating a pulse signal FG (Frequency Generation) that indicates the timing at which the polarity of the Hall signal is inverted. The FG signal may be used as the position detection signal S4.

In a case in which the motor driver 122 employs a sensorless driving method, the motor driver 122 may generate the FG signal based on the back electromotive force that occurs in a coil of the motor 120.

In the present embodiment, the position detection signal S4 is configured as a pulse signal having a negative edge (a positive edge may also be employed) every time the motor 120 rotates a half turn. It should be noted that, in a case in which two blades 112 are attached to the motor 120, the period of the position detection signal S4 matches the scanning period of the beam.

During a normal lighting-on period, the lighting circuit 200 generates a dimming signal S6 that indicates the time waveform of the light amount (on/off states or luminance of emitted light) of the semiconductor light source 110 so as to provide the light distribution pattern indicated by the light distribution instruction data S3a in synchronization with the rotation of the motor 120, i.e., in synchronization with the beam scanning position. With this, the lighting circuit 200 instructs the semiconductor light source to turn on according to the dimming signal S6. Such a series of processing is repeated.

The dimming signal generating unit 210 is implemented in the lamp ECU 206. During the normal lighting-on period, the dimming signal generating unit 210 generates the dimming signal S6 based on the instruction signal S3 and the position detection signal S4. The dimming signal S6 may be configured as a binary signal that corresponds to the on/off states of the semiconductor light source 110. Alternatively, the dimming signal S6 may be configured as a multi-level digital signal. Also, the dimming signal S6 may be configured as a continuous analog signal.

As a method for changing the light amount of the semiconductor light source 110, an analog dimming (analog light reduction) method and a PWM dimming method are known. In the analog dimming method, the amount of current (amplitude) of the driving current $I_{LED}$ is adjusted. In the PWM dimming method, the driving current $I_{LED}$ is turned on and off in a time-sharing manner, and the on/off time ratio is adjusted. For example, the dimming signal S6 generated by the dimming signal generating unit 210 is supplied to an analog dimming input ADIM of the constant current driver 220. The constant current driver 220 generates the driving current $I_{LED}$ having an amount of current that is proportional to the dimming signal S6.

A gap is formed at a boundary between the two blades 112. In some cases, each blade 112 has a mirror surface having lower accuracy at its end portion than that at its central portion. In this case, both ends of each blade 112 may not be used. Accordingly, the semiconductor light source 110 may preferably be turned off for each gap in the scanning period regardless of the light distribution pattern.

In the present embodiment, the gap in the scanning period is associated with a negative edge of the position detection signal S4. Accordingly, during the normal lighting-on period, the dimming signal generating unit 210 generates the dimming signal S6 so as to turn off the semiconductor light source 110 for every negative edge in the position detection signal S4.

Figure 3A:
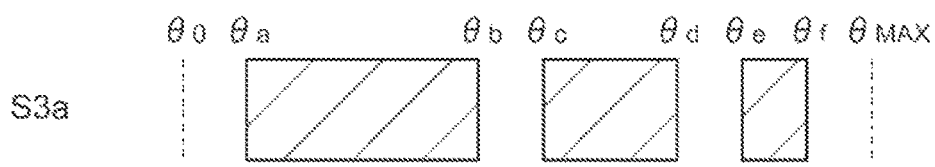
FIGS. 3A through 3C are diagrams for explaining the generation of a dimming signal.
Figure 3B:
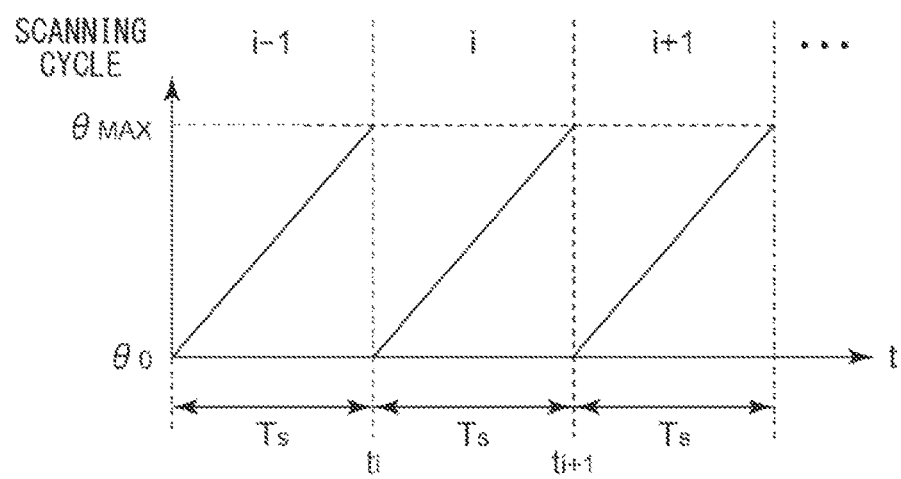
Figure 3C:
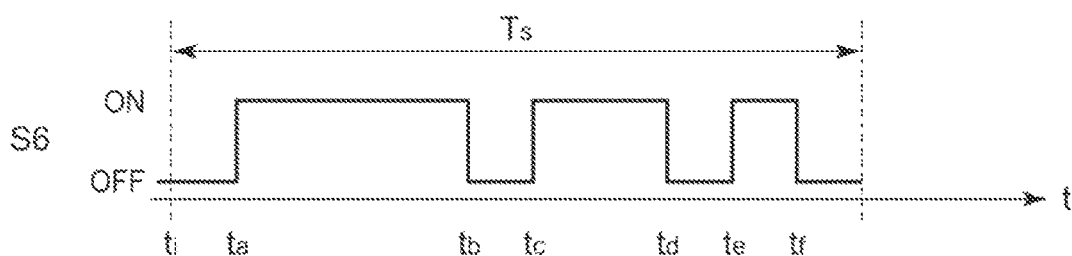

FIGS. 3A through 3C are diagrams for explaining the generation of the dimming signal S6. As shown in FIG. 3A, the light distribution instruction data S3a is supplied as angle information, for example. Description will be made in this example with the left end as $\theta_0$, and with the right end as $\theta_{MAX}$. The light distribution instruction data S3a includes values $\theta_a$, $\theta_b$, $\theta_c$, $\theta_d$, $\theta_e$, and $\theta_f$, each indicating the boundary between the irradiation region and the shielded region. It should be noted that the upper limit of the number of the shielded regions may be restricted.

FIG. 3B shows the time waveform of the scanning angle of the scanning light source 100. The period of the scanning angle is associated with the period of the position detection signal S4.

The angle $\theta$ at an arbitrary time point t is represented by the following Expression (1). Here, Ts represents the scanning period, and $t_i$ represents the start time point of the i-th scanning cycle.

$$\theta(t) = \theta_0 + (\theta_{MAX} - \theta_0)/Ts \times (t - t_i) \quad (1)$$

In the i-th scanning cycle, the time point t at which the output beam (target region 300) of the semiconductor light source 110 is irradiated at an arbitrary angle $\theta$ is represented by the following Expression (2).

$$t = (\theta - \theta_0) Ts/(\theta_{MAX} - \theta_0) + t_i \quad (2)$$

The time points $t_a$ through $t_f$ that correspond to $\theta_a$ through $\theta_f$ are calculated based on the Expression (2). Subsequently, the dimming signal S6 having a signal level that is changed at each of the time points $t_a$ through $t_f$ thus calculated is supplied to the constant current driver 220 for each scanning cycle, thereby controlling the time waveform of the light amount of the semiconductor light source 110. This allows the light distribution pattern to be formed corresponding to the light distribution instruction data S3a shown in FIG. 3A.

With this, the scanning period Ts changes according to the rotational speed of the motor 120, leading to variation of the scanning period Ts with time. Accordingly, in order to provide accurate light distribution control, such an arrangement is required to measure the scanning period Ts for each scanning cycle, and to generate the dimming signal giving consideration to the scanning period Ts. It should be noted that, in a case in which the rotational speed of the motor 120 is ensured, the measurement of the scanning period Ts may be omitted.

Figure 4:
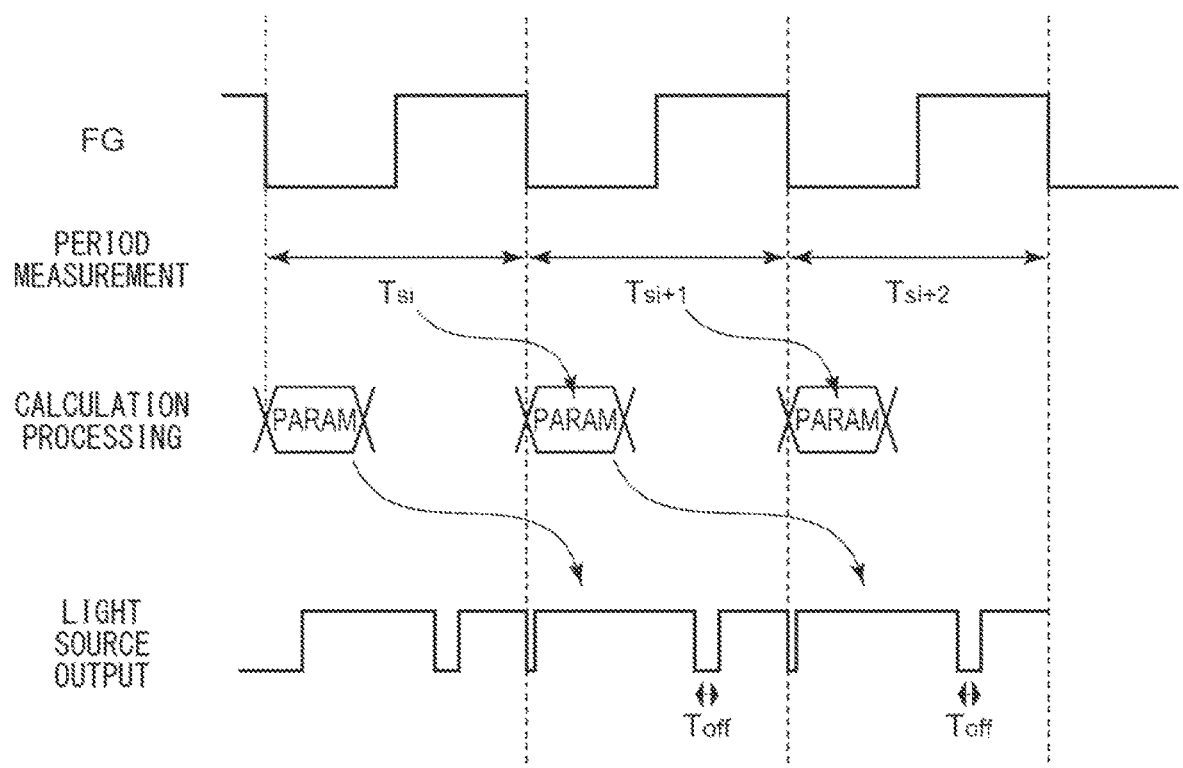
FIG. 4 is a diagram showing a control sequence employed by a lighting circuit for a light source.

FIG. 4 is a diagram showing a control sequence of the lighting circuit 200 for controlling the light source. FIG. 4 shows the control sequence when the motor is rotating at a target speed. Here, $Ts_i$ represents the scanning period of the i-th scanning cycle. As described above, the motor driver 122 is configured to be capable of outputting a pulse-shaped rotational speed detection (FG) signal having a level that transits every time the rotor rotates by a predetermined electric angle (or mechanical angle). The FG signal can be regarded as the position detection signal S4 that indicates the position of the rotor of the motor. Description will be made with reference to FIG. 4 regarding an example in which there is a negative edge in the FG signal at an end of each scanning period.

The scanning period $Ts_i$ measured in the i-th scanning cycle is used to control the light source in the two subsequent cycles.

First, in the i-th scanning cycle, the period $Ts_i$ is measured. The period $Ts_i$ can be measured by measuring the interval between the adjacent negative edges in FG signal using a counter. In the next scanning period, i.e., the (i+1)-th scanning cycle, parameters ($t_a$ through $t_f$ in FIG. 3) required for the dimming signal for the light source are calculated. In a case in which the light amount is changed in a multi-level manner in addition to the on/off control, each parameter may include an amount of current and a time slope of the amount of current at each time point.

In the next scanning cycle, i.e., in the (i+2)-th cycle, the dimming signal S6 is generated based on the parameters calculated in the previous cycle.

Figure 5:
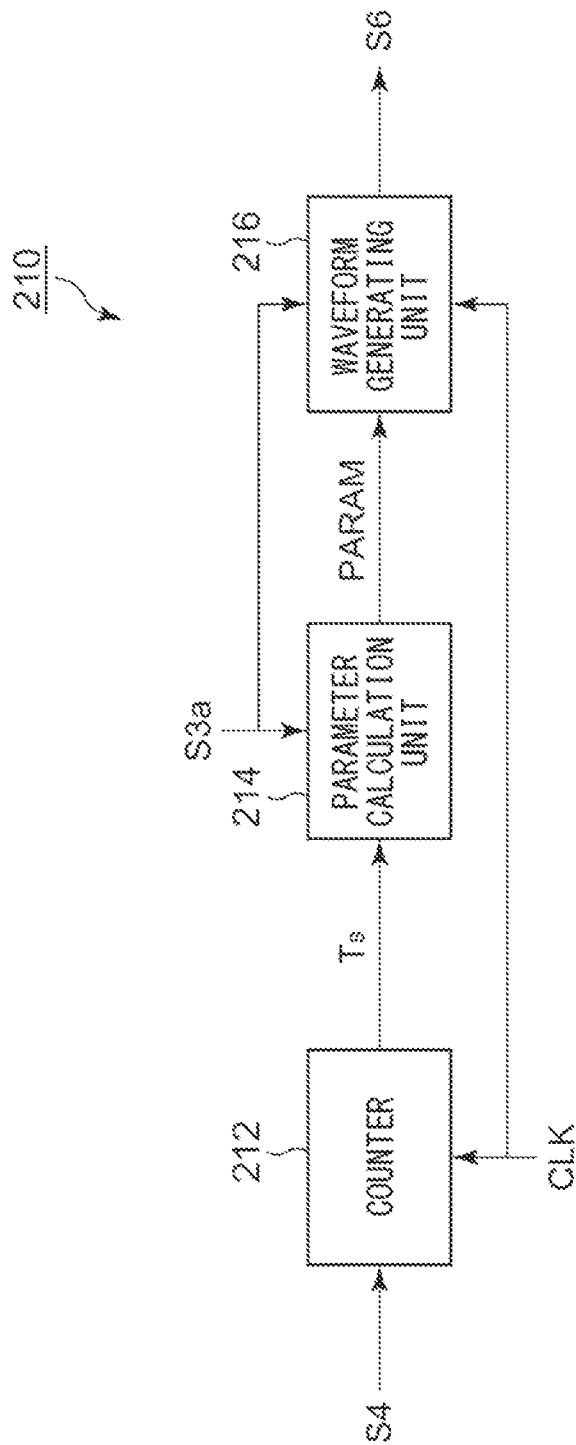
FIG. 5 is a function block diagram showing a dimming signal generating unit.

FIG. 5 is a function block diagram showing the dimming signal generating unit 210. The dimming signal generating unit 210 includes a counter 212, a parameter calculation unit 214, and a waveform generating unit 216. The counter 212 measures the period of the position detection signal S4 using a clock CLK. The parameter calculation unit 214 calculates the parameter PARAM required for the generation of the dimming signal S6 based on the period Ts and the light distribution instruction data S3a. The waveform generating unit 216 generates the dimming signal S6 based on the parameter PARAM obtained by the parameter calculation unit 214 and the clock CLK. Each block of the dimming signal generating unit 210 may be configured as a hardware component. Alternatively, each block of the dimming signal generating unit 210 may be configured as a combination of a software component and a processor that executes the software.

In the control sequence shown in FIG. 4, the scanning period Ts is measured based on the period of the pulse-shaped FG signal. Accordingly, if noise contamination occurs in the FG signal, the scanning period Ts is measured erroneously. FIGS. 6A through 6C are diagrams for explaining the effects of noise on the FG signal. As shown in FIG. 6A, description will be made assuming that noise N1 occurs in the FG signal in the i-th scanning cycle. In this case, the scanning period $Ts_i'$ is measured as a short period. The symbol "'" represents erroneous information hereafter. In the subsequent scanning cycle, i.e., in the (i+1)'-th scanning cycle, the parameters ($t_a$ through $t_f$ in FIG. 3) required for the generation of the dimming signal for the light source are calculated using the period $Ts_i'$ in the immediately previous cycle. Subsequently, in the next scanning cycle, i.e., in the (i+2)-th cycle, the dimming signal S6 is generated based on the parameters calculated in the previous cycle, so as to control the light source.

FIG. 6B is a diagram showing the light distribution pattern to be generated when noise N1 does not occur, i.e., when the scanning period Ts is correctly measured. In this case, a portion of a leading vehicle 400 is shielded.

FIG. 6C shows the light distribution pattern generated when the scanning period Ts is measured erroneously due to the effects of the noise N1. When the scanning period Ts is measured as a short period due to the noise N1, the parameters $t_a$ through $t_f$ are calculated erroneously. As a result, the light distribution pattern is scaled ($Ts_i'/Ts_i$)-fold in the horizontal direction. Accordingly, light is irradiated to the leading vehicle 400, leading to glare being imparted to the leading vehicle 400. In addition, a region 402 to which light is to be irradiated is shielded.

In order to reduce such a noise effect, the lighting circuit 200 has the following features.

The lighting circuit 200 measures the scanning period Ts for each scanning cycle. When a predetermined relation is satisfied between a current value $T_{CUR}$ which is the measurement value of the period in the current cycle and a reference value $T_{REF}$ which is the measurement value of the period used to generate the dimming signal S6 in the immediately previous cycle, the parameters required for the generation of the dimming signal are calculated using the current value $T_{CUR}$, and the referenced value $T_{REF}$ is updated to the current value $T_{CUR}$ thus used.

Conversely, when a predetermined relation is not satisfied between the current value $T_{CUR}$ and the reference value $T_{REF}$, instead of the current value $T_{CUR}$, the lighting circuit 200 uses the reference value $T_{REF}$ in calculation of the parameters to be used for the generation of the dimming signal S6. In this case, the reference value $T_{REF}$ is not updated.

For example, when the rate of variation α of the current value $T_{CUR}$ with respect to the reference value $T_{REF}$ deviates from an allowable range, the lighting circuit 200 does not use the current value $T_{CUR}$ in the calculation of the parameters in the next cycle. In this case, the predetermined relation is that the rate of variation α is within the allowable range.

For example, the rate of variation α is defined as $T_{CUR}/T_{REF}$. When the rate of variation α is within a predetermined range (e.g., ±10%, i.e., 0.9 to 1.1), the current value $T_{CUR}$ is used to calculate the parameters for the next cycle. Otherwise, the reference value $T_{REF}$ is used to calculate the parameters for the next cycle.

Alternatively, the rate of variation α is defined as $(T_{CUR}-T_{REF})/T_{REF}$. When the rate of variation α is within a predetermined range (e.g., −0.1 to +0.1), the current value $T_{CUR}$ may be used to calculate the parameters. Otherwise, the reference value $T_{REF}$ may be used to calculate the parameters.

Alternatively, when a difference between the reference value $T_{REF}$ and the current value $T_{CUR}$ deviates from the allowable range, the lighting circuit 200 may not use the current value $T_{CUR}$ in the calculation of the parameters.

FIG. 7 is a diagram for explaining the parameter calculation based the relation between on the reference value $T_{REF}$ and the current value $T_{CUR}$. FIG. 7 shows the operation when the position detection signal S4 (FG signal) does not include noise. When the rotational speed of the motor is stable, the current value $T_{CUR}$ measured for each scanning cycle is substantially constant. Accordingly, a predetermined relation is satisfied between the reference value $T_{REF}$ and the current value $T_{CUR}$. Accordingly, the measurement value Ts of the immediately previous cycle is used to calculate the parameters for each scanning cycle.

Figure 8:
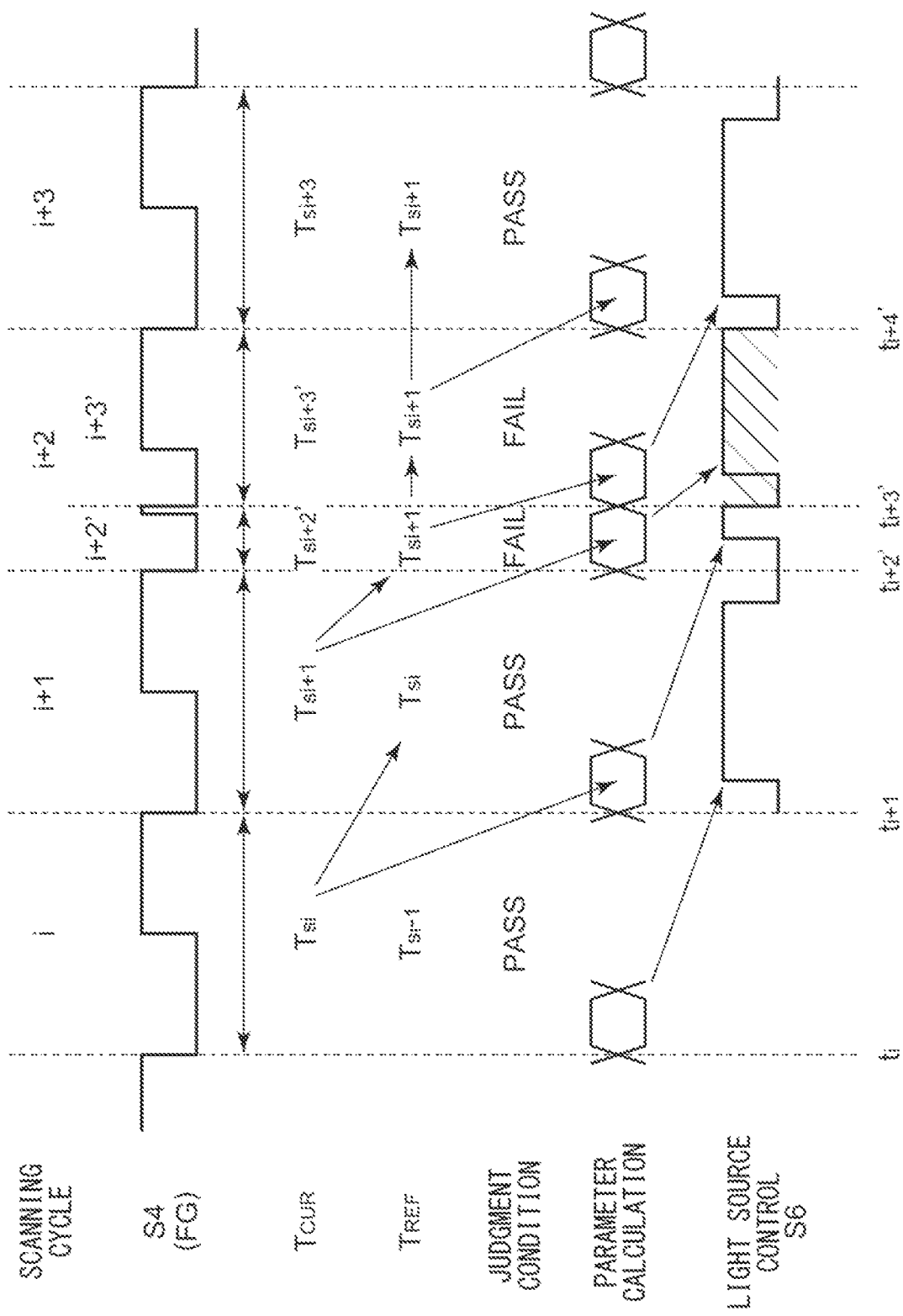
FIG. 8 is a diagram for explaining the generation of a dimming signal based on the relation between the reference value $T_{REF}$ and the current value $T_{CUR}$.

FIG. 8 is a diagram for explaining the generation of the dimming signal S6 based on the relation between the reference value $T_{REF}$ and the current value $T_{CUR}$. FIG. 8 shows the operation when the position detection signal S4 (FG signal) includes noise. Description will be made assuming that the noise N1 is included in the position detection signal S4 in the (i+2)-th scanning cycle.

In the (i+2)'-th scanning cycle, the dimming signal S6 is generated based on the parameters calculated in the immediately previous scanning cycle, i.e., in the (i+1)-th cycle. Accordingly, the dimming signal S6 having a correct waveform is obtained for a period from $t_{i+2}'$ to $t_{i+3}'$. However, the current value calculated in the (i+2)'-th scanning cycle deviates from the reference value, and accordingly, a fail judgement is made. Accordingly, the reference value $Ts_{i+1}$ in this scanning cycle is maintained as it is.

Next, the operation transits at the time point $t_{i+3}'$ to the next cycle. During a period from $t_{i+3}'$ to $t_{i+3}$, the erroneous dimming signal S6 is output. This portion is indicated by hatching. At the subsequent time point $t_{i+3}$, the operation transits to the (i+3)-th scanning cycle. In this cycle, instead of the parameters calculated in the (i+2)'-th scanning period or in the (i+3)'-th scanning period, the parameters calculated based on the (i+1)-th scanning period $Ts_{i+1}$ are used. Accordingly, the dimming signal S6 having a correct waveform is obtained.

The above is the operation of the lighting circuit 200. As shown in FIG. 8, neither the scanning period $Ts_{i+2}'$ nor the scanning period $Ts_{i+3}'$, which are the periods subject to the effect of noise, is used to calculate the parameter in any scanning cycle. With this, the dimming signal S6 is disturbed in only the period (hatched portion) immediately after noise occurs. However, after the time point $t_{i+3}$, the operation is returned to the normal operation.

As described above, with the lighting circuit 200 according to the embodiment 1, this allows the effects of noise to be reduced.

It should be noted that this control operation is effective only in a case in which the rotational speed of the motor is stabilized. This is because, during acceleration (deceleration) of the motor, it is not possible to judge whether the variation in the measurement value of the period is due to the change in the rotational speed or due to noise. In order to solve such a problem, the lighting circuit 200 may preferably use the current value $T_{CUR}$ in the calculation of the parameters regardless of the rate of variation during a period (which will be referred to as an "exception period") before the rotational speed of the motor 120 becomes stable after the rotation of the motor 120 is started.

For example, after the beginning of the start-up operation, pass/fail judgement may be repeated for a judgment condition. When a pass judgment has occurred once or has consecutively occurred a predetermined number of times, an assumption may be made that the rotational speed has become stable, and accordingly, the operation may be switched from the exception period to the normal period. With such an arrangement, detection can be made in a sure manner with regard to the stabilization of the rotational speed of the motor.

Alternatively, after a predetermined time elapses after the beginning of the start-up operation, an assumption may be made that the rotational speed has become stable, and accordingly, the exception period may be ended. Alternatively, when an edge occurs a predetermined number of times in the position detection signal S4, an assumption may be made that the rotational speed has become stable, and accordingly, the exception period may be ended. In these cases, in the exception period, there is no requirement to calculate the rate of variation.

Embodiment 2

Figure 9:
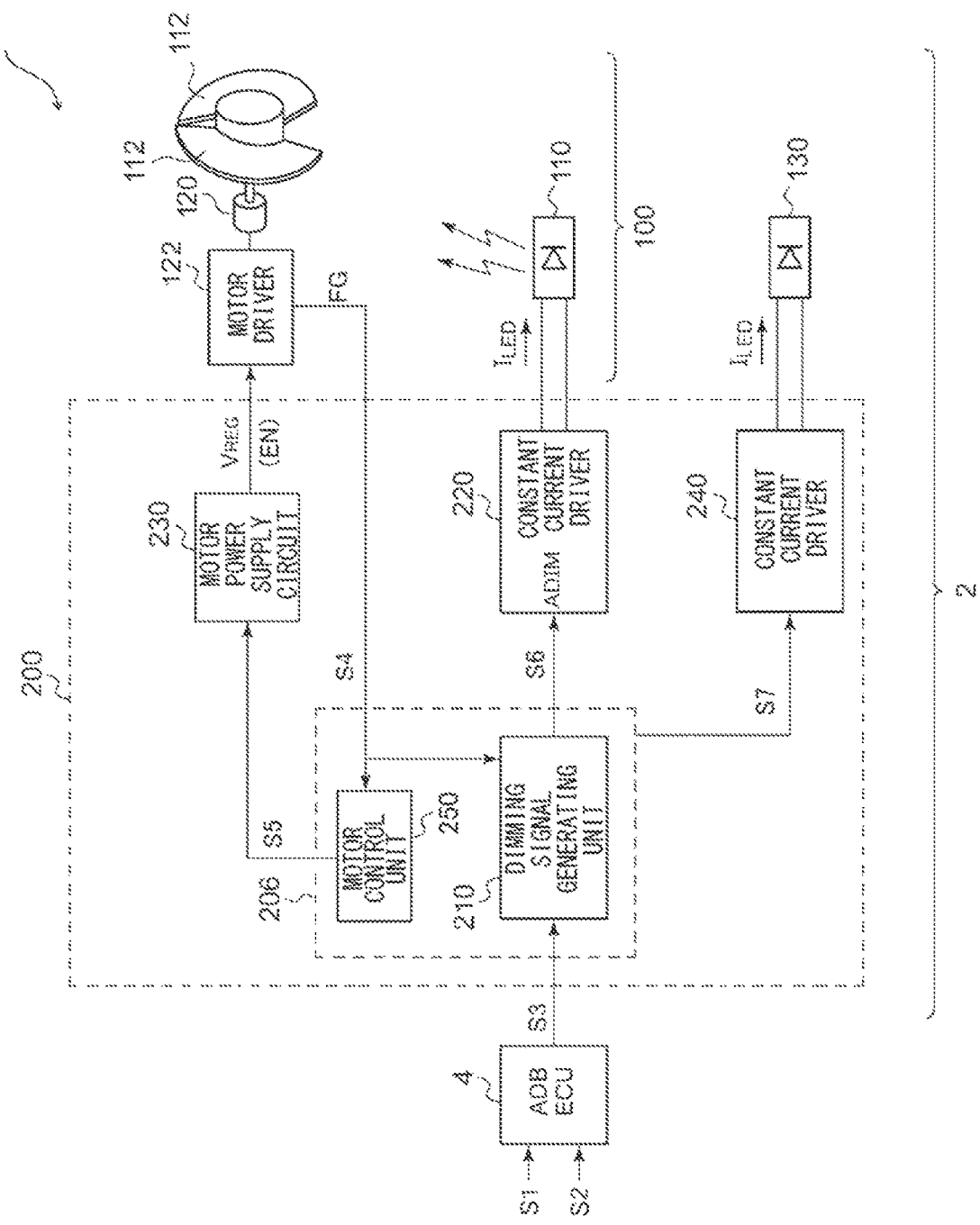
FIG. 9 is a block diagram showing a lamp system provided with an automotive lamp according to an embodiment 2.

FIG. 9 is a block diagram showing the lamp system 1 provided with the automotive lamp 2 according to an embodiment 2. The lamp system 1 includes the in-vehicle ECU 4 and the automotive lamp 2.

Redundant description already made in the embodiment 1 will be omitted. Description will be made below focusing on the points of difference or changes.

The lamp ECU 206 includes a motor control unit 250 that supplies a power supply control signal S5 for instructing the motor power supply circuit 230 to generate and stop the power supply voltage $V_{REG}$. The rotation and stopping of the motor 120 are controlled based on the power supply control signal S5. In the present embodiment, after the ignition of the vehicle is turned on, the power supply control signal S5 is asserted (e.g., set to the high level) in response to the first lighting-on instruction for turning on the semiconductor light source 110, thereby starting the rotation of the motor 120.

When an event which is a trigger for starting the rotation of the motor 120 occurs, the lighting circuit 200 asserts the power supply voltage $V_{REG}$ that functions as an enable signal EN. Examples of such an event which is the trigger for starting the rotation of the motor 120 include a first lighting-on instruction for the low-beam light source 130 or the high-beam semiconductor light source 110 after the ignition if turned on. Alternatively, the event which is the trigger for starting the rotation of the motor 120 may be an ignition-on event.

After the assertion of the enable signal EN ($V_{REG}$), when the lighting circuit 200 detects that a state in which the period Ts of the FG signal that functions as the position detection signal S4 is longer than a predetermined threshold value $T_{TH}$, i.e., a state in which the rotational speed of the motor is lower than a predetermined value, continues for a predetermined first time Ta, the lighting circuit 200 judges that the motor is in the lock state. In this state, the lighting circuit 200 negates (cuts off, i.e., sets to 0 V) the enable signal EN ($V_{REG}$).

As described above, in the present embodiment, the enable signal EN is the power supply voltage $V_{REG}$ to be supplied to the motor driver 122. In the lock state of the motor 120, the driving current that flows through the motor 120 becomes larger than that in the normal state. The excessive driving current is supplied from the motor power supply circuit 230 configured as a power supply for the motor driver 122.

As can be understood from the above description, with the present embodiment, in the lock state, excessive current flows through the motor power supply circuit 230 in addition to the motor 120 and the motor driver 122. This leads to a potential problem of heat generation in such components or degradation of reliability. In a case in which the motor power supply circuit 230 is configured as a DC/DC converter, a problem of heat generation in the motor power supply circuit 230 is mitigated to some extent. However, in a case in which the motor power supply circuit 230 is configured as a linear regulator, the problem of heat generation in the motor power supply circuit 230 becomes more marked. When the temperature of the motor power supply circuit 230 becomes high, this leads to degradation of the reliability of semiconductor elements that form the motor power supply circuit 230. Furthermore, when the temperature in a housing of the automotive lamp 2 rises due to heat generation in the motor power supply circuit 230, this leads to an increase in the temperature of the semiconductor light sources 110 and 130, resulting in a potential problem of the occurrence of temperature derating.

In order to solve such a problem, the first time Ta may preferably be determined in a range so as to ensure the reliability of all of the motor 120, the motor driver 122, and the motor power supply circuit 230. For example, the first time Ta may be determined in a range on the order of 0.5 to 3 seconds.

Subsequently, the lighting circuit 200 repeats a retry operation in which, after a predetermined second time Tb elapses after the enable signal $V_{REG}$ is negated, the enable signal $V_{REG}$ is asserted again. The second time Tb is preferably determined such that it is sufficient to mitigate the temperature of the motor 120, the motor driver 122, and the motor power supply circuit 230, which will rise during the first time Ta, and such that it is longer than the first time Ta. For example, an arrangement may be made in which Ta=1 second, and Tb=8 seconds. That is to say, the first time Ta and the second time Tb are determined giving consideration to an increase and decrease in the temperature of the motor power supply circuit 230.

Subsequently, when the period of the position detection signal does not become shorter than the threshold value after the retry operation is executed multiple times, the lighting circuit 200 makes an abnormal stop (fail latch) in a state in which the enable signal $V_{REG}$ is negated. Subsequently, the retry operation is not executed.

For example, when the period Ts of the position detection signal does not become shorter than the threshold value $T_{TH}$ after a predetermined third time (time-up time) $T_C$ after the first negation of the enable signal $V_{REG}$, the lighting circuit 200 may execute the fail latch. The third time $T_C$ may preferably be set to a period on the order of several dozen seconds to several hundred seconds. Specifically, the third time TC may preferably be set on the order of 30 to 240 seconds. As an example, the third time $T_C$ may be set on the order of 120 seconds.

Figure 10:
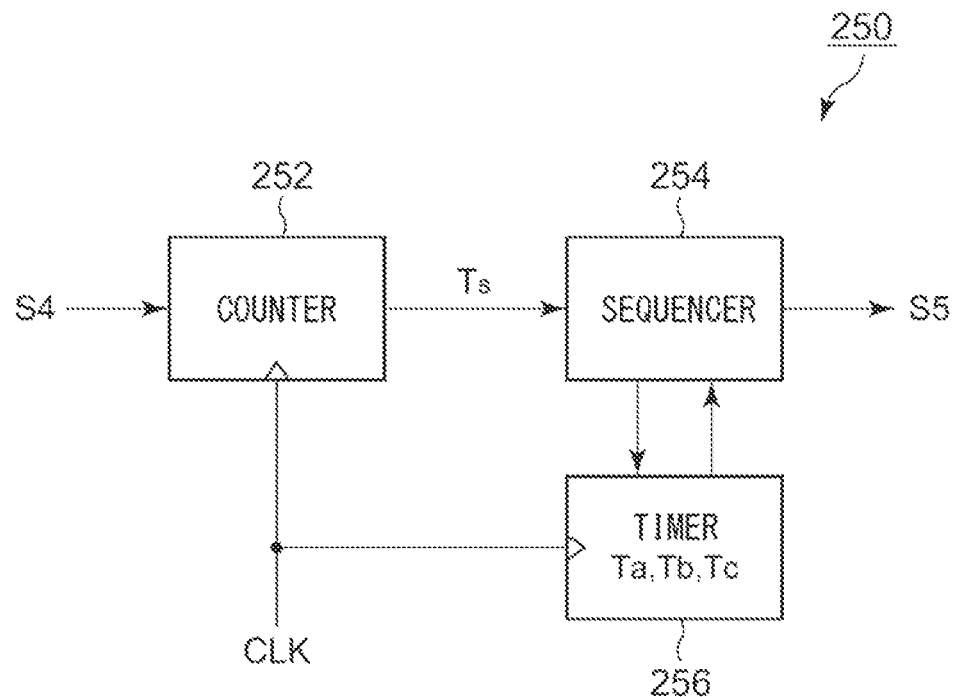
FIG. 10 is a block diagram showing a motor control unit having a lock protection function.

FIG. 10 is a block diagram showing the motor control unit 250 having a lock protection function. The motor control unit 250 includes a counter 252, a sequencer 254, and a timer 256. Each block of the motor control unit 250 may be configured as a hardware component. Also, each block of the motor control unit 250 may be configured as a combination of a software component and a processor that executes the software.

The counter 252 measures the scanning period Ts of the position detection signal S4. It should be noted that the counter 252 may also be configured to function as the counter 212 shown in FIG. 5. The sequencer 254 compares the scanning period Ts with the threshold value $T_{TH}$, controls the timer 256 based on the comparison result so as to manage the time, and controls the power supply control signal S5.

Figure 11:
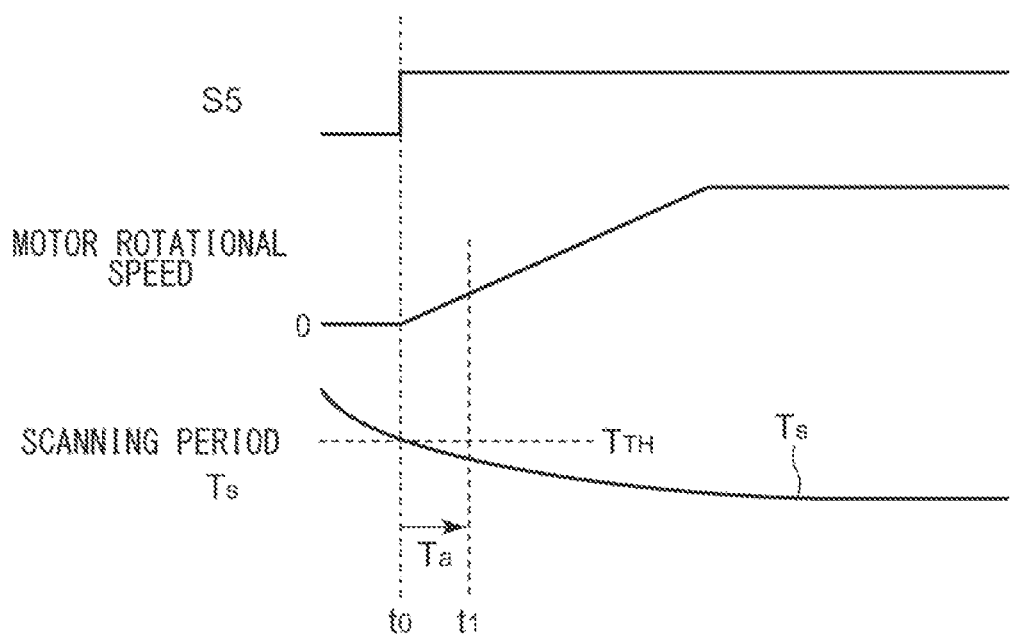
FIG. 11 is an operation waveform diagram showing a lock protection operation of the motor control unit shown in FIG. 10.

FIG. 11 is an operation waveform diagram showing a lock protection operation of the motor control unit 250 shown in FIG. 10. FIG. 11 shows the operation when the motor 120 is not locked. Upon detecting an event which is a trigger for starting the rotation of the motor 120 at the time point $t_0$, the sequencer 254 asserts the power supply control signal S5. This asserts the enable signal $V_{REG}$ for the motor driver 122, thereby starting the rotation of the motor 120. Furthermore, at the time point to, the sequencer 254 starts the timer 256 so as to start the measurement of the first time Ta.

In the normal state, the scanning period Ts decreases according to an increase of the rotational speed of the motor 120. The scanning period Ts becomes shorter than the threshold value $T_{TH}$ before the first time Ta elapses. Accordingly, the assertion of the power supply control signal S5 is maintained, thereby continuing the rotation of the motor 120.

Figure 12A:
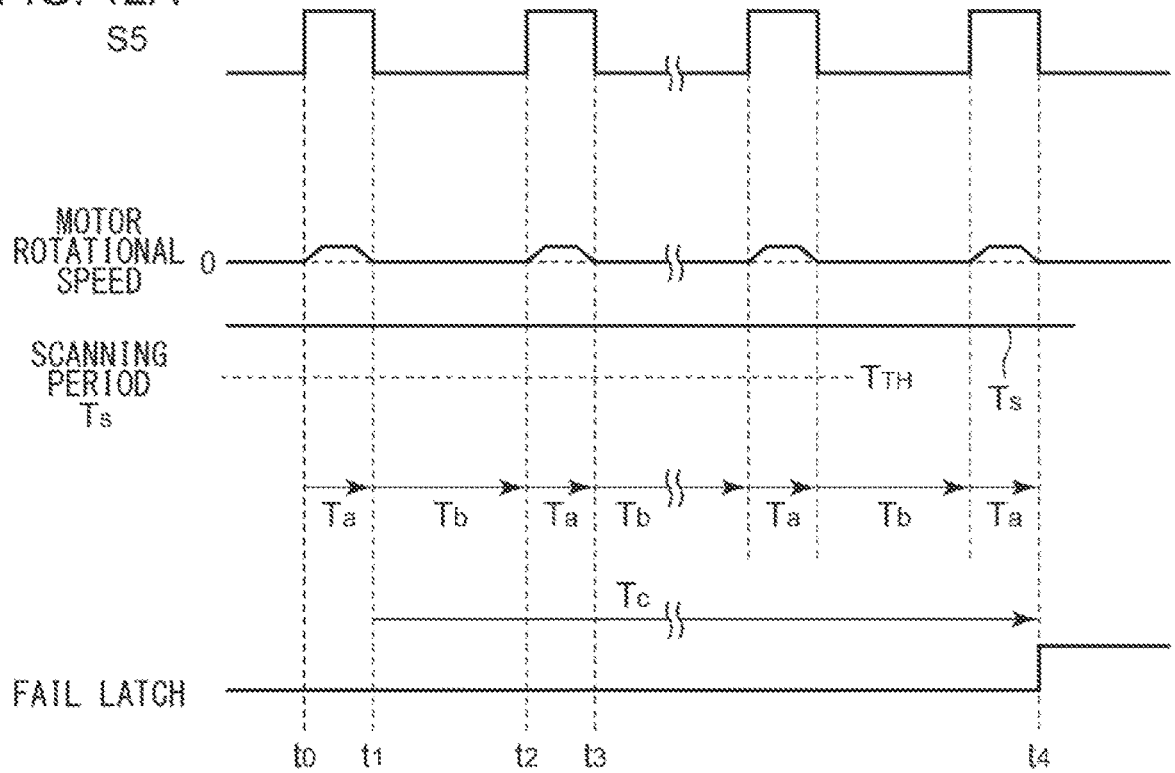
FIGS. 12A and 12B are diagrams each showing an operation when a motor is locked.
Figure 12B:
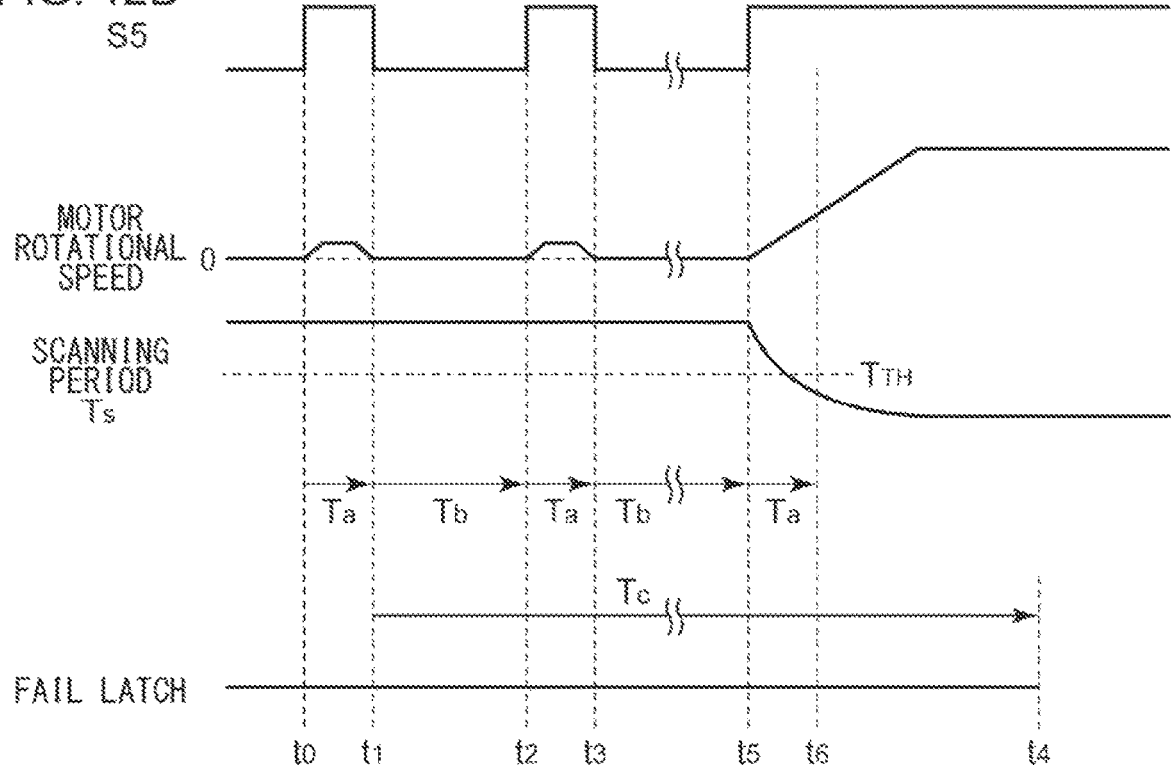

FIGS. 12A and 12B shows the operation when the motor 120 is locked. Referring to FIG. 12A, description will be made. At the time point $t_0$, the power supply control signal S5 is asserted, and the driving of the motor 120 starts. However, the motor 120 is locked. Accordingly, the rotational speed does not increase, thereby maintaining a state in which the scanning period Ts is longer than the threshold value $T_{TH}$. When the period Ts of the position detection signal S4 does not become shorter than the threshold value $T_{TH}$ at the time point $t_1$ after the first time Ta elapses, judgement is made that the motor is in the lock state, and the power supply control signal S5 is negated. The sequencer 254 starts the timer 256 so as to measure the second time Tb and the third time Tc. Subsequently, at the time point $t_2$ after the second time Tb elapses, the power supply control signal S5 is asserted again. In addition, the sequencer 254 starts the measurement of the first time Ta, and retries the startup of the motor 120. When the period Ts of the position detection signal S4 does not become shorter than the threshold value $T_{TH}$ at the time point $t_3$ after the first time Ta elapses, judgment is made that the motor 120 is in the lock state, and the power supply control signal S5 is negated.

When the motor 120 is locked, the retry operation is repeated. Subsequently, when the period Ts of the position detection signal S4 does not become shorter than the threshold value $T_{TH}$ at the time point t4 after the third time Tc elapses after the time point $t_1$, a time-up operation is executed. Specifically, a fail latch is executed in a state in which the enable signal $V_{REG}$ is negated, and the subsequent retry operation is suspended.

FIG. 12B shows the operation when the lock is released by the retry operation. The operation from the time point $t_0$ to the time point $t_3$ is the same as that shown in FIG. 12A. In a period in which the retry operation is repeated multiple times, in some cases, foreign matter is removed due to the torque generated by the rotor of the motor 120, or such foreign matter is removed due to vibration that occurs due to traveling of the vehicle. Description will be made assuming that the motor 120 is unlocked at the time point $t_5$. In this case, the rotational speed of the motor 120 rapidly increases, and the scanning period Ts becomes shorter than the threshold value $T_{TH}$ at the time point $t_6$ after the first time Ta elapses. In this case, the assertion of the power supply control signal S5 is maintained. The above is the operation in the lock state.

With the automotive lamp 2 according to the present embodiment, even in a case in which the motor driver 122 has no lock protection function, this allows the lighting circuit 200 to provide such a lock protection function. Furthermore, when a lock state is detected once, the retry operation is repeated multiple times instead of immediately providing a fail latch. With this, the probability of the cause of the lock state being removed is increased in the retry operation executed multiple times. When the cause of the lock state is removed before the fail latch operation, this allows the motor 120 to be normally started up, thereby allowing the lamp to normally turn on. This provides improved product value of the automotive lamp 2.

It should be noted that description has been made in the embodiment 2 with reference to FIGS. 12A and 12B regarding an arrangement in which the measurement of the predetermined third time Tc is started at the time point $t_1$. However, the present invention is not restricted to such an arrangement. Also, the measurement of the third time Tc may be started at the time point $t_0$ at which an event being a trigger for starting the rotation of the motor occurs.

Alternatively, instead of measuring the third time Tc, the lighting circuit 200 may count the number of times the retry operation is executed. When the period Ts of the position detection signal does not become shorter than the threshold value $T_{TH}$ after the number of times the retry operation is executed reaches a predetermined value, the lighting circuit 200 may execute the fail latch operation.

Embodiment 3

Description will be made regarding an outline of an embodiment 3. The lighting circuit according to the embodiment 3 controls a scanning light source. The scanning light source includes a semiconductor light source and a motor, and is structured to scan output light of the semiconductor light source in front of a lamp according to the movement of the motor. The lighting circuit includes: a constant current driver structured to supply a driving current that corresponds to a light source control signal to the semiconductor light source; a light source control signal generator structured to generate the light source control signal so as to obtain a light distribution pattern that corresponds to light distribution instruction data; and a delay time measurement device structured to measure a delay time required for the transition of lighting-on and lighting-off states of the semiconductor light source from the change of the light source control signal.

With such an arrangement in which the delay time is actually measured, this arrangement is capable of controlling the on/off states of the semiconductor light source giving consideration to variation and fluctuation of the delay time. This allows the accuracy of the light distribution pattern to be improved.

Also, the light source control signal may be corrected based on the delay time. With such an arrangement in which the timing of the change point of the light source control signal is corrected giving consideration to the actually measured delay time, this allows the effects of variation and fluctuation of the delay time to be canceled.

Also, the light distribution instruction data may be corrected based on the delay time. With such an arrangement in which the light distribution instruction data is corrected giving consideration to the actually measured delay time, this allows the effects of variation and fluctuation of the delay time to be canceled.

Also, the constant current driver may include: a constant current output converter coupled to the semiconductor light source; a bypass switch provided in parallel with the semiconductor light source; and a buffer structured to drive the bypass switch according to the light source control signal. Also, the delay time measurement device may measure the delay time based on a voltage across the semiconductor light source.

Also, the constant current driver may include: a constant voltage output converter coupled to the semiconductor light source; and a constant current source coupled in series with the semiconductor light source, and structured to be capable of switching on/off states according to the light source control signal. Also, the delay time measurement device may measure the delay time based on a current that flows through the semiconductor light source or a voltage across the semiconductor light source.

Also, the light source control signal generator may include: a calculation processing unit structured to calculate a parameter that defines an on/off timing of the semiconductor light source so as to obtain the light distribution pattern, and to correct the parameter based on the delay time; and a waveform generator structured to generate the light source control signal based on the corrected parameter.

Figure 13:
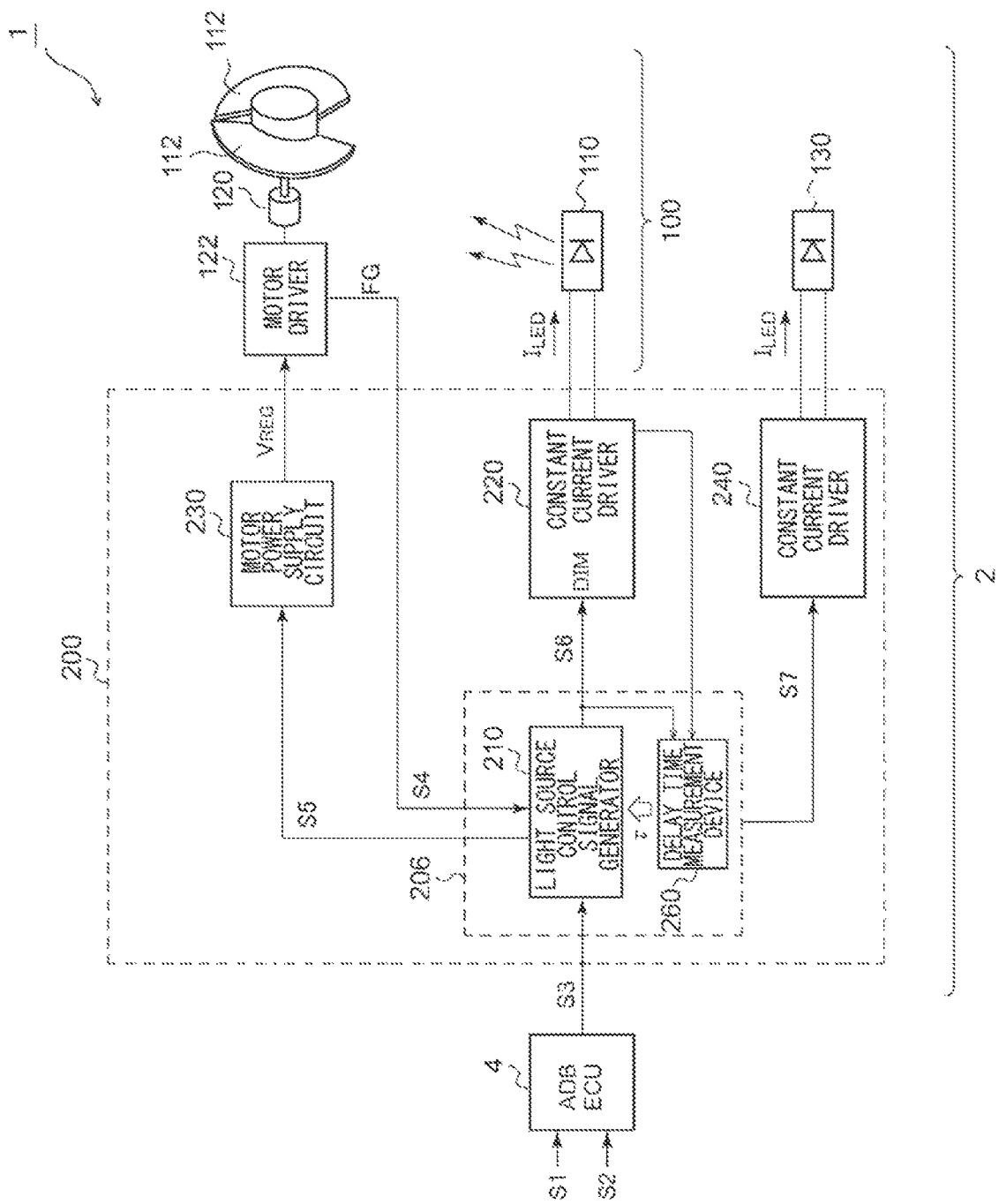
FIG. 13 is a block diagram showing a lamp system provided with an automotive lamp according to an embodiment 3.

Description will be made below with reference to the drawings regarding the automotive lamp 2 according to an embodiment 3. FIG. 13 is a block diagram showing the lamp system 1 provided with the automotive lamp 2 according to the embodiment 3. The lamp system 1 includes the in-vehicle Electronic Control Unit (ECU) 4 and the automotive lamp 2.

Redundant description in common with the embodiment 1 or the embodiment 2 will be omitted, and description will be made below focusing on the points of difference or changes between them. The power supply control signal S6 in the embodiment 3 corresponds to the dimming signal S6 in the embodiments 1 and 2.

Returning to FIG. 13, there is a delay time (which will also be referred to as a "control delay") until the lighting-on/lighting-off state (on/off state) of the semiconductor light source 110 changes from the change of the light source control signal S6. FIG. 14 is a diagram for explaining the control delay. The delay until the semiconductor light source 110 turns on from the light source control signal S6 transiting from the off level (low level) to the on level (high level) will be rereferred to as a "lighting-on delay $\tau_{ON}$". The delay until the semiconductor light source 110 turns off from the light source control signal S6 transiting from the on level (high level) to the off level (low level) will be rereferred to as a "lighting-off delay $\tau_{OFF}$".

The lighting-on delay $\tau_{ON}$ and the lighting-off delay $\tau_{OFF}$ are affected by individual variation. Furthermore, the lighting-on delay $\tau_{ON}$ and the lighting-off delay $\tau_{OFF}$ also change according to temperature fluctuation and power supply voltage fluctuation. The variation or fluctuation of the lighting-on delay $\tau_{ON}$ and the lighting-off delay $\tau_{OFF}$ leads to a shift of the lighting-on timing (or the lighting-off timing). This leads to a situation in which the beam is irradiated to a region to which a beam is not to be irradiated, or a situation in which a beam is not irradiated to a region to which the beam is to be irradiated. That is to say, this leads to degraded accuracy of the generation of the light distribution pattern.

In order to solve such a problem, the present inventors have investigated the following comparison technique. FIGS. 15A through 15C are diagrams for explaining the comparison technique. In the comparison technique, the design values (delay specification values) $\tau_{ON(SPEC)}$ and $\tau_{OFF(SPEC)}$ of the lighting-on delay $\tau_{ON}$ and the lighting-off delay $\tau_{OFF}$ are prepared. The delay specification values $\tau_{ON(SPEC)}$ and $\tau_{OFF(SPEC)}$ are determined such that they include a margin determined giving consideration to the delay variation and temperature fluctuation.

In the design stage of the in-vehicle ECU 4, the designer of the in-vehicle ECU 4 is provided with the delay angles $\theta\tau_{ON(SPEC)}$ and $\theta\tau_{OFF(SPEC)}$ that correspond to the delay specification values $\tau_{ON(SPEC)}$ and $\tau_{OFF(SPEC)}$.

$$\theta\tau_{ON(SPEC)}=(\theta_{MAX}-\theta_0)\times\tau_{ON(SPEC)}/Ts$$

$$\theta\tau_{OFF(SPEC)}=(\theta_{MAX}-\theta_0)\times\tau_{OFF(SPEC)}/Ts$$

The in-vehicle ECU 4 is designed so as to generate the light distribution instruction data S3a giving consideration to the delay angles $\theta\tau_{ON(SPEC)}$ and $\theta\tau_{OFF(SPEC)}$.

FIG. 15A shows an ideal light distribution pattern 400 in a certain traveling situation. In this case, the region between $\theta_1$ and $\theta_2$ is configured as a shielded region. The other region is configured as an irradiation region.

FIG. 15B shows light distribution instruction data 404 giving consideration to the delay angles $\theta\tau_{ON(SPEC)}$ and $\theta\tau_{OFF(SPEC)}$. The light distribution instruction data 404 is obtained by shifting the boundary $\theta_1$ defined in the ideal light distribution pattern 400 to the left by $\theta\tau_{OFF(SPEC)}$, and by shifting the boundary $\theta_2$ defined in the ideal light distribution pattern 400 to the right by $\theta\tau_{ON(SPEC)}$.

FIG. 15C shows a light distribution pattern 406 that is actually formed when the vehicle is traveling. In such a situation in which the delay angle $\theta_{\tau OFF(REAL)}$ in the actual traveling is smaller than the specification value $\theta\tau_{OFF(SPEC)}$, a shielded region 408 has a width that is excessively larger than the width of the leading vehicle 402, leading to the occurrence of a dark region in front of the vehicle.

The above is the comparison technique and accompanying problems. Returning to FIG. 13, description will be made regarding the lighting circuit 200.

The lighting circuit 200 is provided with a delay time measurement device 260 that measures the delay times $\tau_{ON}$ and $\tau_{OFF}$ from the change in the light source control signal S6 up to the change of the lighting-on/lighting-off state (on/off state) of the semiconductor light source 110. In a case in which the delay times $\tau_{ON}$ and $\tau_{OFF}$ can be assumed to be the same, only one from among the delay times $\tau_{ON}$ and $\tau_{OFF}$ may preferably be measured. The delay time measurement device 260 may be implemented in the microcontroller of the lamp ECU 206. Also, the delay time measurement device 260 may be provided as a hardware component that differs from the microcontroller.

In the present embodiment, the delay times $\tau_{ON}$ and $\tau_{OFF}$ measured by the delay time measurement device 260 are supplied to the light source control signal generator 210 of the lamp ECU 206. The light source control signal generator 210 operates giving consideration to the delay times $\tau_{ON}$ and $\tau_{OFF}$. Specifically, the timing of the change point of the light source control signal S6 is shifted on the time axis so as to cancel the variation and fluctuation of the delay times $\tau_{ON}$ and $\tau_{OFF}$.

Figure 16A:
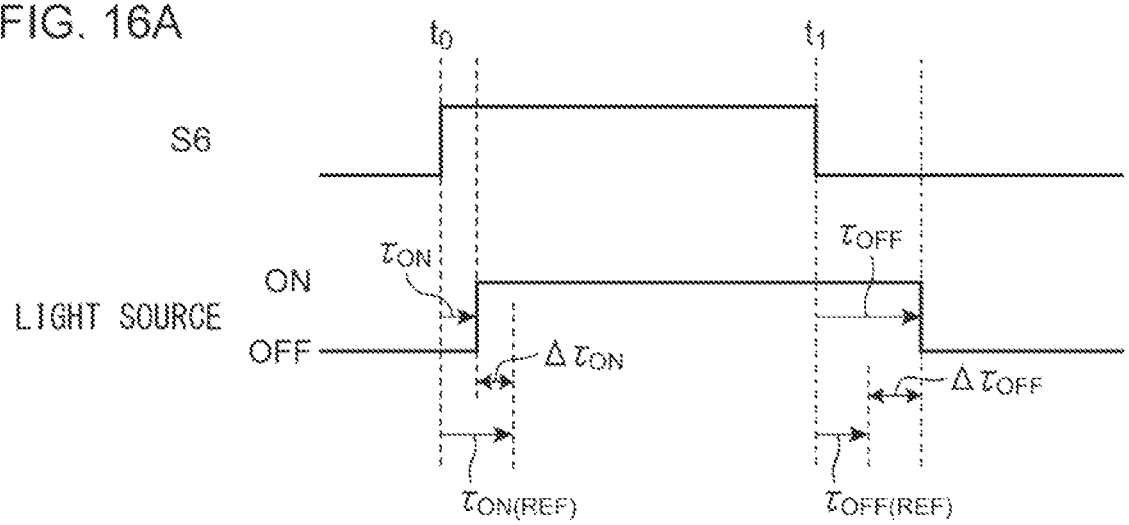
FIGS. 16A and 16B are diagrams for explaining timing correction of a light source control signal based on a delay time.
Figure 16B:
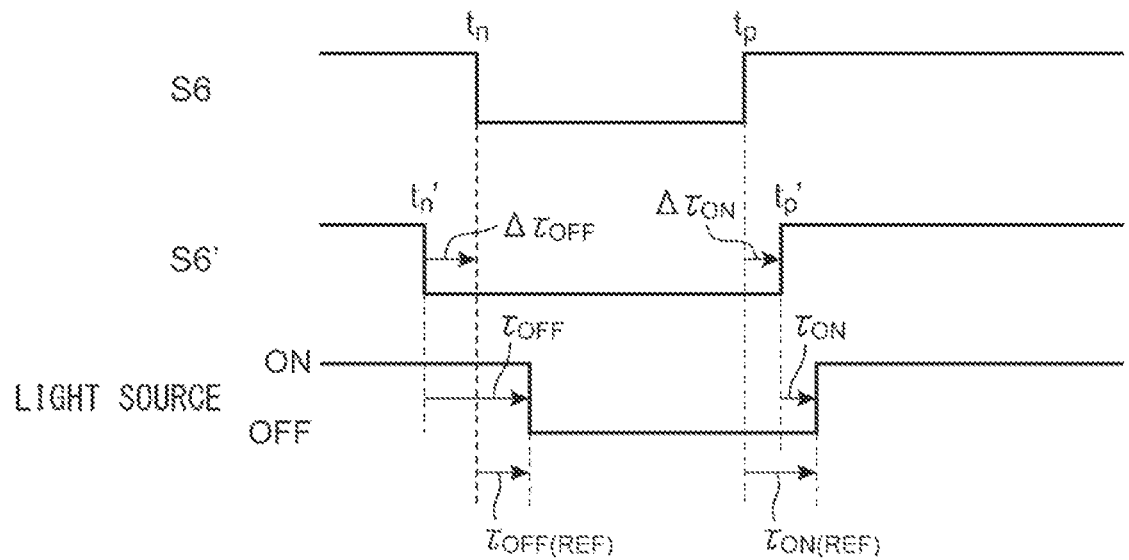

FIGS. 16A and 16B are diagrams for explaining the timing correction of the light source control signal S6 based on the delay time.

FIG. 16A shows the measurement of the delay time. In this example, the light source control signal S6 has a positive edge at the time point $t_0$, and has a negative edge at the time point $t_1$. After the positive edge occurs in the light source control signal S6 at the time point $t_0$, the on time $\tau_{ON}$ up to a time point at which the semiconductor light source 110 turns on is measured. Furthermore, after the negative edge occurs in the light source control signal S6 at the time point $t_1$, the off time $\tau_{OFF}$ up to a time point at which the semiconductor light source 110 turns off is measured.

The light source control signal generator 210 holds the target values $\tau_{OFF(REF)}$ and $\tau_{ON(REF)}$ of the delay times $\tau_{OFF}$ and $\tau_{ON}$. The light source control signal generator 210 calculates the difference $\Delta\tau_{OFF}$ between the delay time $\tau_{OFF}$ and the target value $\tau_{OFF(REF)}$. In the same manner, the light source control signal generator 210 calculates the difference $\Delta\tau_{ON}$ between the delay time $\tau_{ON}$ and the target value $\tau_{ON(REF)}$.

$$\Delta\tau_{OFF}=\tau_{OFF(REF)}-\tau_{OFF} \quad (3)$$

$$\Delta\tau_{ON}=\tau_{ON(REF)}-\tau_{ON} \quad (4)$$

The delay times $\tau_{ON}$ and $\tau_{OFF}$ may be measured for every cycle. Also, the delay times $\tau_{ON}$ and $\tau_{OFF}$ may be measured once for every several to several dozen cycles. Also, the delay times $\tau_{ON}$ and $\tau_{OFF}$ may be measured at predetermined time intervals.

FIG. 16B is a diagram for explaining correction processing for the light source control signal S6 based on the delay times $\tau_{ON}$ and $\tau_{OFF}$. In this example, the light source control signal S6 before correction has a negative edge at a time point $t_n$, and has a positive edge at a time point $t_p$. The time points $t_n$ and $t_p$ are parameters obtained by converting the angle information included in the light distribution instruction data S3a into time information based on the Expression (1).

The corrected light source control signal S6' can be obtained by shifting the time point $t_n$ that corresponds to the negative edge of the light source control signal S6 by $\Delta\tau_{OFF}$, and by shifting the time point $t_p$ that corresponds to the positive edge by $\Delta\tau_{ON}$. The number of positive edges and negative edges is not restricted.

$$t_n' = t_n + \Delta\tau_{OFF} \quad (5)$$

$$t_p' = t_p + \Delta\tau_{ON} \quad (6)$$

The constant current driver 220 supplies a driving current $I_{LED}$ based on the corrected light source control signal S6' to the semiconductor light source 110. The semiconductor light source 110 turns off after $\tau_{OFF}$ elapses from the time point $t_n'$ of the negative edge in the corrected light source control signal S6'. Furthermore, the semiconductor light source 110 turns on after $\tau_{ON}$ elapses from the time point $t_p'$ of the positive edge in the corrected light source control signal S6'. That is to say, the semiconductor light source 110 turns off after the predetermined time $\tau_{OFF(REF)}$ from the lighting-off time point $t_n$ obtained from the light distribution instruction data S3a regardless of variation or fluctuation of the lighting-off delay $\tau_{OFF}$. Furthermore, the semiconductor light source 110 turns on after the predetermined time $\tau_{ON(REF)}$ elapses from the lighting-on time point $t_p$ obtained from the light distribution instruction data S3a regardless of variation or fluctuation of the lighting-on delay $\tau_{ON}$.

The correction processing can be implemented in the parameter calculation unit 214 shown in FIG. 5. That is to say, the parameter calculation unit 214 converts the angle information included in the light distribution instruction data S3a into the time information ($t_p$, $t_n$) according to the Expression (2). The time information ($t_p$, $t_n$) represents the light source control signal S6 before correction. Subsequently, the time information ($t_p$, $t_n$) obtained based on the Expression (2) is corrected according to the Expressions (5) and (6), and the corrected time information ($t_n'$, $t_p'$) is supplied as the parameter PARAM to the waveform generator 216 configured as a downstream stage. The waveform generator 216 generates the corrected light source control signal S6' based on the parameter PARAM including the corrected time information ($t_n'$, $t_p'$).

The above is the configuration and the operation of the lighting circuit 200. With the lighting circuit 200 in which the lighting-on delay time $\tau_{ON}$ and the lighting-off time $\tau_{OFF}$ are measured, this arrangement is capable of controlling the timing at which the semiconductor light source 110 turns on and off, giving consideration to the variation and fluctuation of the delay times $\tau_{ON}$ and $\tau_{OFF}$.

More specifically, the timing of the change point of the light source control signal S6 is corrected giving consideration to the actually measured delay times $\tau_{ON}$ and $\tau_{OFF}$. This allows the effects of variation and fluctuation of the delay times $\tau_{ON}$ and $\tau_{OFF}$ to be canceled.

With the correction of the delay times, the lighting-on delay $\tau_{ON}$ and the lighting-off delay $\tau_{OFF}$ are maintained at constant values (i.e., $\tau_{ON(REF)}$ and $\tau_{OFF(REF)}$) in the automotive lamp 2 as viewed from the in-vehicle ECU 4. This allows the in-vehicle ECU 4 to operate without the need to give consideration to a margin of the delay time. With the comparison technique, as a result of the operation giving consideration to a margin of the delay time, in some cases, this leads to a situation as shown in FIG. 15C in which the shielded region 408 becomes excessively wide. In contrast, with the present embodiment, this allows the shielded region to have a width that is close to an ideal width, thereby providing improved accuracy of the light distribution pattern.

Figure 17:
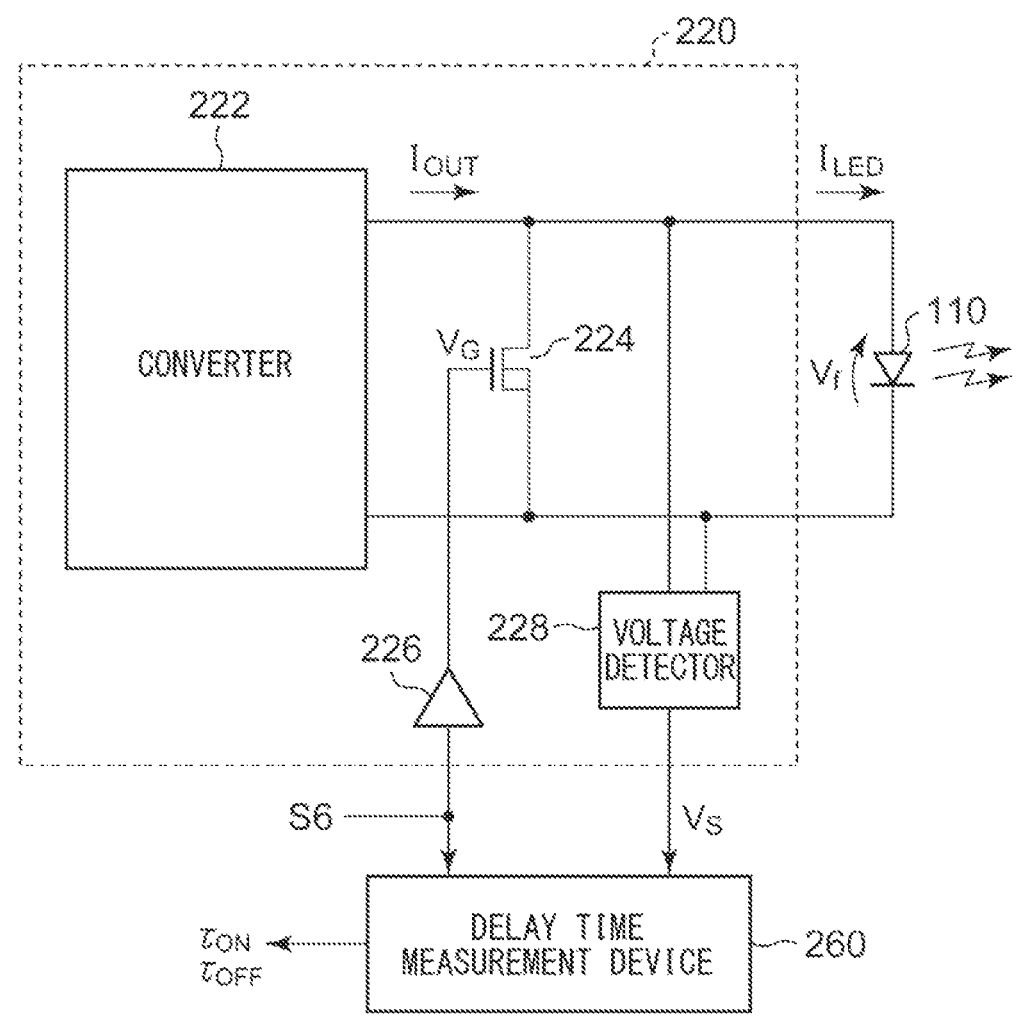
FIG. 17 is a circuit diagram showing an example configuration of a constant current driver.

FIG. 17 is a circuit diagram showing an example configuration of the constant current driver 220. The constant current driver 220 includes a converter 222, a bypass switch 224, a buffer 226, and a voltage detector 228. The converter 222 is coupled to the semiconductor light source 110, and is configured as a constant current output converter such that its output current $I_{OUT}$ is maintained at a constant value.

The bypass switch 224 is provided in parallel with the semiconductor light source 110. When the bypass switch 224 is turned off, the output current $I_{OUT}$ of the converter 222 is supplied as a driving current $I_{LED}$ to the semiconductor light source 110, thereby turning on the semiconductor light source 110. When the bypass switch 224 is turned on, the output current $I_{OUT}$ of the converter 222 is bypassed to the bypass switch 224. In this state, the driving current $I_{LED}$ that flows through the semiconductor light source 110 becomes zero, thereby turning off the semiconductor light source 110. The bypass switch 224 is configured as an N-channel Metal Oxide Semiconductor (MOS) transistor.

The buffer 226 drives the bypass switch 224 according to the light source control signal S6 (S6').

The voltage detector 228 outputs a detection voltage Vs that corresponds to a voltage Vf across the semiconductor light source 110. It should be noted that the voltage detector 228 may be omitted. In this case, the voltage at the anode of the semiconductor light source 110 may be employed as the detection voltage Vs.

The delay time measurement device 260 measures the delay times $\tau_{ON}$ and $\tau_{OFF}$ based on the light source control signal S6 and the voltage detection signal Vs.

Figure 18:
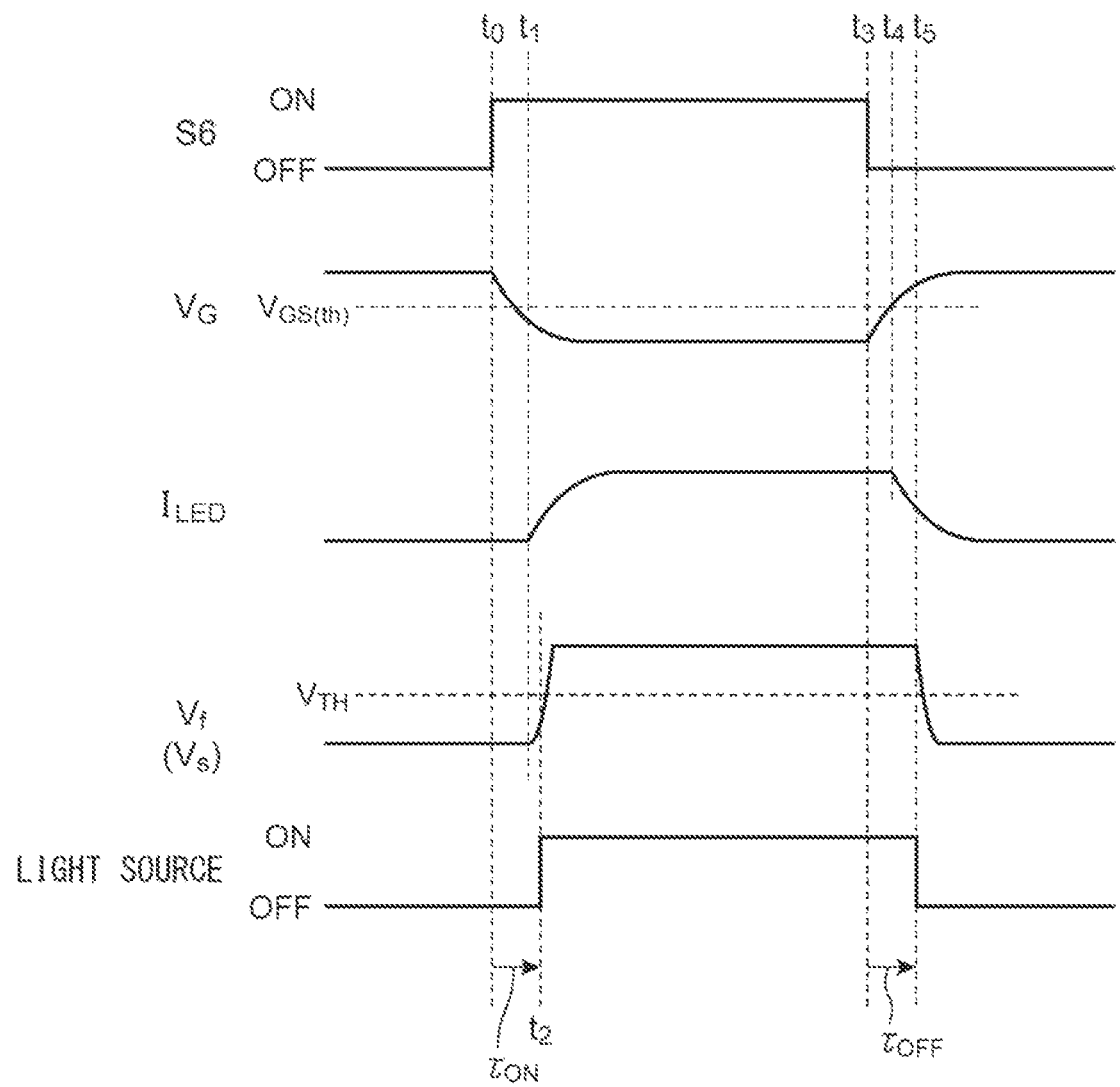
FIG. 18 is an operation waveform diagram showing the operation of the constant current driver shown in FIG. 17.

FIG. 18 is an operation waveform diagram showing the operation of the constant current driver 220 shown in FIG. 17. Before the time point $t_0$, the light source control signal S6 is set to the off level (low level). In this state, the buffer 226 applies a high-level gate signal $V_G$ to the gate of the bypass switch 224. In this state, the bypass switch 224 is turned on, thereby turning off the semiconductor light source 110.

When the light source control signal S6 transits to the on level at the time point $t_1$, the buffer 226 changes the gate signal $V_G$ of the bypass switch 224 toward the low level. When the gate signal $V_G$ becomes lower than the threshold value $V_{GS(th)}$, the bypass switch 224 is turned off. In this state, the driving current $I_{LED}$ starts to flow through the semiconductor light source 110, thereby increasing the voltage (forward voltage) Vf across the semiconductor light source 110. The delay time measurement device 260 sets the time point $t_2$ at which the detection signal Vs that corresponds to the forward voltage Vf crosses a predetermined threshold voltage Vth as the lighting-on time point at which the semiconductor light source 110 turns on. Furthermore, the delay time measurement device 260 sets ($t_2 - t_0$) as the lighting-on delay $\tau_{ON}$.

When the light source control signal S6 transits to the off level at the time point $t_3$, the buffer 226 changes the gate signal $V_G$ of the bypass switch 224 toward the high level. When the gate signal $V_G$ becomes higher than the threshold value $V_{GS(th)}$, the bypass switch 224 is turned on. In this state, instead of the current flowing through the semiconductor light source 110, a current starts to flow through the bypass switch 224 side. This reduces the driving current $I_{LED}$ that flows through the semiconductor light source 110, thereby reducing the forward voltage Vf of the semiconductor light source 110. The delay time measurement device 260 sets the time point $t_5$ at which the detection signal Vs that corresponds to the forward voltage Vf crosses the predetermined threshold voltage Vth as the lighting-off time point at which the semiconductor light source 110 turns off. Furthermore, the delay time measurement device 260 sets ($t_5 - t_3$) as the lighting-off delay $\tau_{OFF}$.

Figure 19:
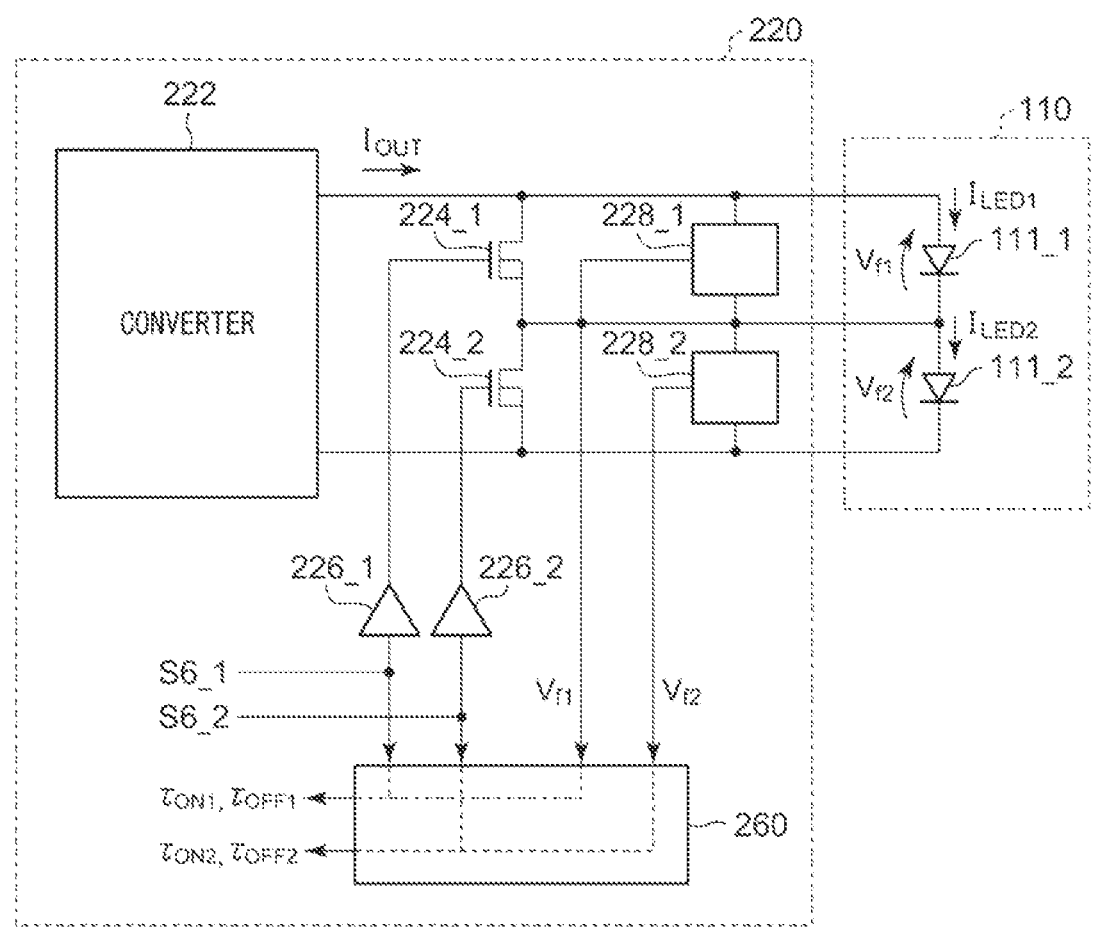
FIG. 19 is a circuit diagram showing another example configuration of the constant current driver.

FIG. 19 is a circuit diagram showing another example configuration of the constant current driver 220. The semiconductor light source 110 includes multiple light-emitting devices 111_1 through 111_N (N≥2) coupled in series. FIG. 19 shows an arrangement in which N=2. However, the number of the light sources is not restricted in particular. The constant current driver 220 includes a converter 222, multiple bypass switches 224_1 through 224_N, multiple buffers 226_1 through 226_N, and multiple voltage detectors 228_1 through 228_N. The converter 222 is coupled to the semiconductor light source 110, and is configured as a constant current output converter such that its output current $I_{OUT}$ is maintained at a constant value.

The bypass switches 224_1 through 224_N are arranged in parallel with the corresponding light-emitting devices 111_1 through 111_N, respectively. When the bypass switch 224_# (#=1 to N) is turned off, the output current $I_{OUT}$ of the converter 222 is supplied as the driving current $I_{LED\#}$ to the light-emitting device 111_#, thereby turning on the light-emitting device 111_#. When the bypass switch 224_# is turned on, the output current $I_{OUT}$ of the converter 222 is bypassed to the bypass switch 224_#. In this state, the driving current $I_{LED\#}$ that flows through the light-emitting device 111_# becomes zero, thereby turning off the light-emitting device 111_#.

The buffers 226_1 through 226_N drive the corresponding bypass switches 224_1 through 224_N according to the light source control signals S6_1 through S6_N, respectively.

The voltage detector 228_# (#=1 to N) outputs the detection voltage $Vs_\#$ with the ground voltage as a reference according to the voltage $Vf_\#$ across the light-emitting device 111_#.

The delay time measurement device 260 measures the delay times $\tau_{ON\#}$ and $\tau_{OFF\#}$ of the light-emitting device 111_# based on a corresponding pair of the light source control signal S6_# and the voltage detection signal $Vs_\#$.

Description has been made in the embodiment 3 regarding an arrangement in which the light source control signal S6 is corrected based on the measured delay times $\tau_{ON}$ and $\tau_{OFF}$. However, the present invention is not restricted to such an arrangement. For example, the light distribution instruction data S3a may be corrected based on the measured delay times $\tau_{ON}$ and $\tau_{OFF}$. In this case, the delay times $\tau_{ON}$ and $\tau_{OFF}$ are converted into angle correction values $\Delta\theta_{ON}$ and $\Delta\theta_{OFF}$.

$$\Delta\theta_{ON}=(\theta_{MAX}-\theta_0)/Ts \times \theta_{ON}$$

$$\Delta\theta_{OFF}=(\theta_{MAX}-\theta_0)/Ts \times \theta_{OFF}$$

With this, the angle information θ included in the light distribution instruction data S3a before correction may preferably be corrected based on $\Delta\theta_{ON}$ and $\Delta\theta_{OFF}$. This modification is effective in a case in which the light distribution instruction data S3a is generated by an internal component of the automotive lamp 2.

Figure 20:
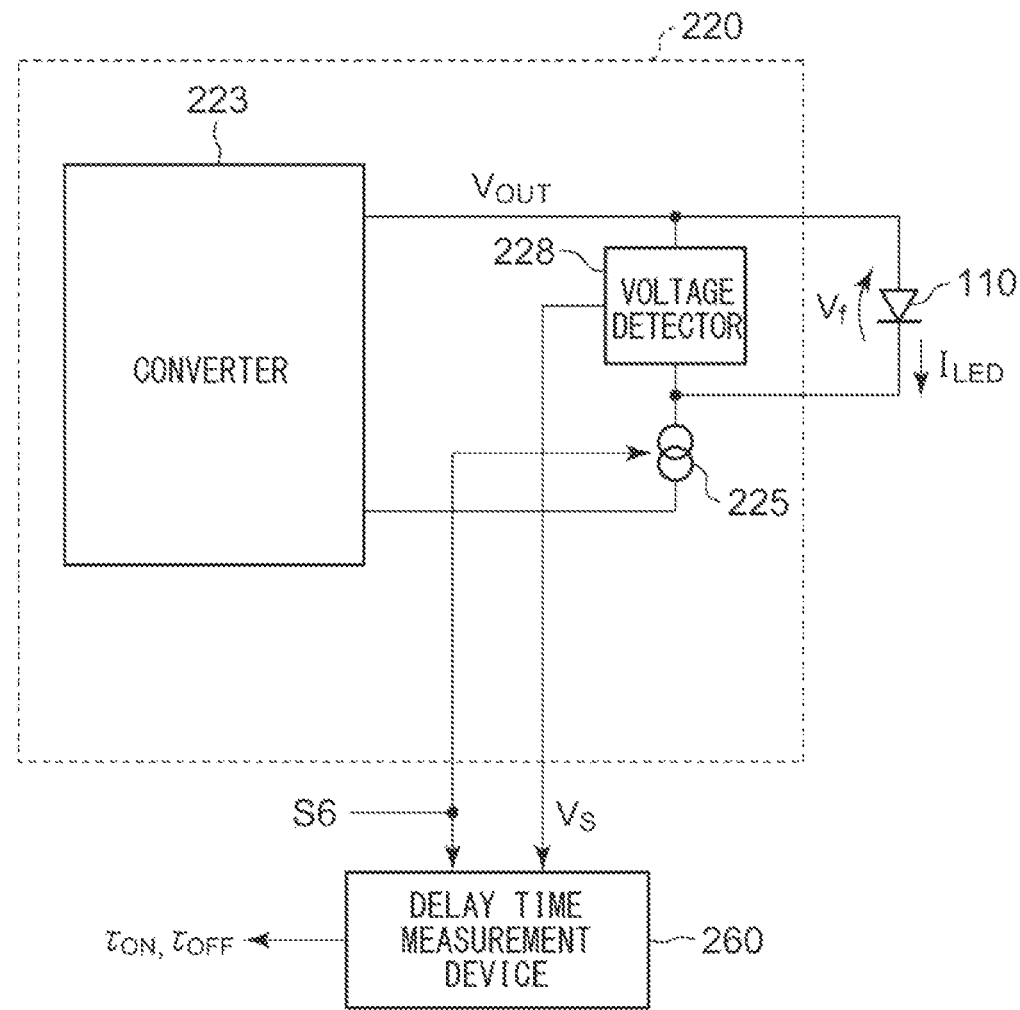
FIG. 20 is a circuit diagram showing a modification of the constant current driver.

FIG. 20 is a circuit diagram showing a modification of the constant current driver 220. The constant current driver 220 includes a converter 223 and a constant current source 225. The converter 223 is coupled to the semiconductor light source 110, and is configured as a constant voltage output converter so as to generate a constant output voltage $V_{OUT}$. The constant current source 225 is coupled in series with the semiconductor light source 110, and is configured to be capable of switching between the on/off states according to the light source control signal S6. The voltage detector 228 generates the detection signal Vs that indicates a voltage Vf across the semiconductor light source 110. The delay time measurement device 260 measures the delay times $\Delta\theta_{ON}$ and $\Delta\theta_{OFF}$ based on the voltage across the semiconductor light source 110.

In FIG. 20, instead of the voltage detector 228, a current detector configured to generate a detection signal Is that corresponds to the current $I_{LED}$ that flows through the semiconductor light source 110 may be provided. The current detector may include a sense resistor provided on a path of the current $I_{LED}$ and an amplifier that amplifies the voltage drop that occurs across the sense resistor so as to generate the detection signal Is. Alternatively, the current detector may include a replica transistor configured to flow a current that is proportional to that of an output transistor of the constant current source 225. Also, the detection signal Is may be generated based on the current that flows through the replica transistor. In this case, the delay time measurement device 260 may measure the delay times $\theta_{ON}$ and $\theta_{OFF}$ based on the current $I_{LED}$ indicated by the detection signal Is.

Description has been made above regarding the embodiments 1 through 3. The above-described embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Modification 1

The method for generating the position detection signal S4 is not restricted to such an arrangement using a Hall element. For example, the position detection signal S4 may be generated using an optical method for detecting the position of the rotor of the motor 120 or other kinds of methods using a rotary encoder or a resolver. Alternatively, an arrangement may include a photosensor provided on the back side of the blade 112 and a light source for position detection configured to irradiate light from the surface side of the blade 112 toward the photosensor. Also, the blade 112 may be provided with a slit or pinhole. This arrangement is capable of detecting a timing at which the slit or pinhole passes over the photosensor. The slit may be configured as a gap between the two blades 112. Also, as the light source for position detection, an infrared light source may be employed. Also, the light source for position detection may be configured as the semiconductor light source 110. As described above, various kinds of variations can be made for the method for generating the position detection signal S4.

Modification 2

Description has been made in the embodiment regarding an arrangement including two blades 112. However, the number of the blades is not restricted in particular. Also, an arrangement may be made including a single blade or three or more blades. Description has been made in the embodiment regarding an arrangement in which the blades 112 are rotationally driven. Also, the blades 112 may be reciprocally driven.

Modification 3

As the semiconductor light source 110, instead of LEDs, various kinds of semiconductor light sources such as laser diodes (LDs), organic electroluminescence (EL) devices, etc. may be employed.

Modification 4

Figure 21:
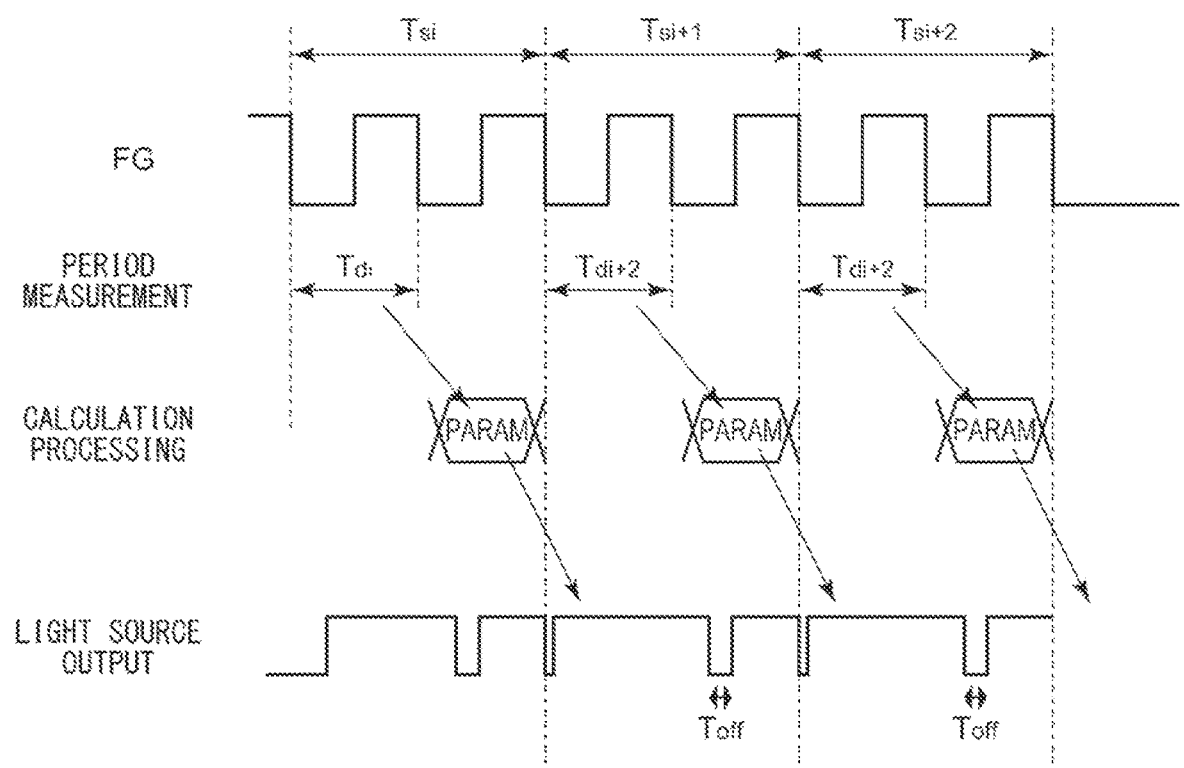
FIG. 21 is a diagram for explaining a control sequence of a light source according to a modification.

Description has been made in the embodiment regarding an arrangement in which the period is measured in a cycle that differs from a cycle in which the parameter is calculated. However, the present invention is not restricted to such an arrangement. FIG. 21 is a diagram for explaining a control sequence of the light source according to a modification. In this modification, the position detection signal S4 has a period that is an integer (M) division of the scanning period Ts. In this case, the scanning period Ts can be obtained by measuring the period Td of the position detection signal S4, and by multiplying the period Td by M. With this, the period is measured in a first half of a scanning cycle, and the parameters are calculated in a second half of a scanning cycle. This allows the light source to be controlled in each cycle based on the period in the immediately previous cycle.

Modification 5

Description has been made in the various embodiments regarding an arrangement in which the power supply voltage $V_{REG}$ supplied by the motor power supply circuit 230 is configured as an enable signal. However, the present invention is not restricted to such an arrangement. Also, the power supply voltage $V_{REG}$ may be provided by the motor power supply circuit 230 at all times, and an enable signal EN that is independent of the power supply voltage $V_{REG}$ may be supplied to the motor driver 122.

Modification 6

Figure 22A:
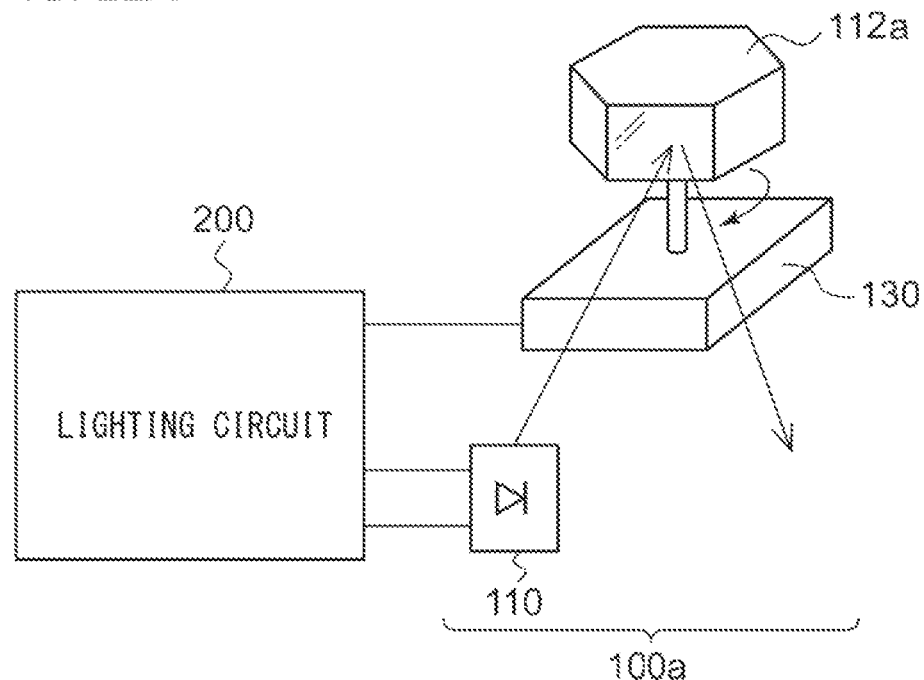
FIGS. 22A and 22B are diagrams each showing a modification of the scanning light source.
Figure 22B:
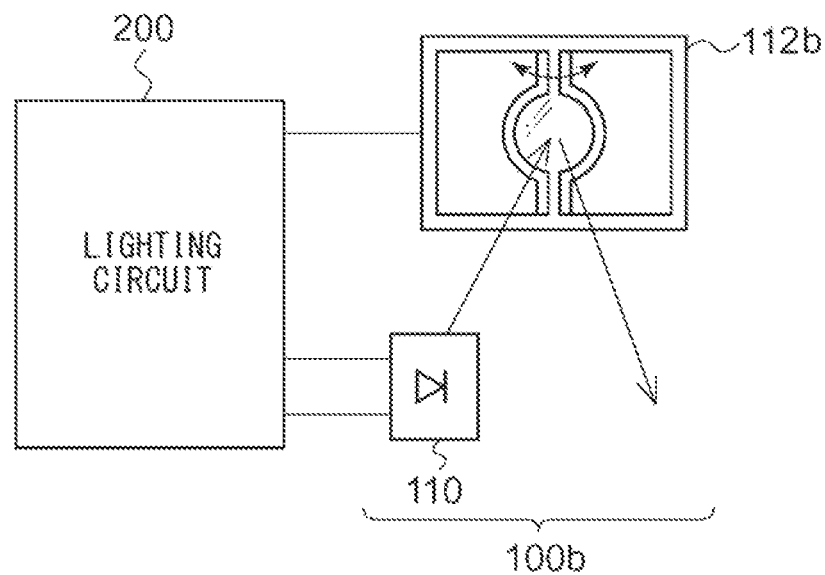

Also, various modifications may be made for the configuration of the scanning light source 100. Description has been made in the embodiment regarding an arrangement in which the blade 112 is employed as a reflector. However, the present invention is not restricted to such an arrangement. FIGS. 22A and 22B are diagrams each showing a modification of the scanning light source 100. Scanning light sources 100a and 100b shown in FIGS. 22A and 22B are each configured as a combination of the semiconductor light source 110 and a reflector 112a as with the arrangement shown in FIG. 1. The reflector 112a shown in FIG. 22A is a polygonal mirror. The reflector 112a may be configured as a mirror galvanometer. A reflector 112b shown in FIG. 22B is a Micro Electro Mechanical System (MEMS) scan mirror.

Modification 7

Figure 23A:
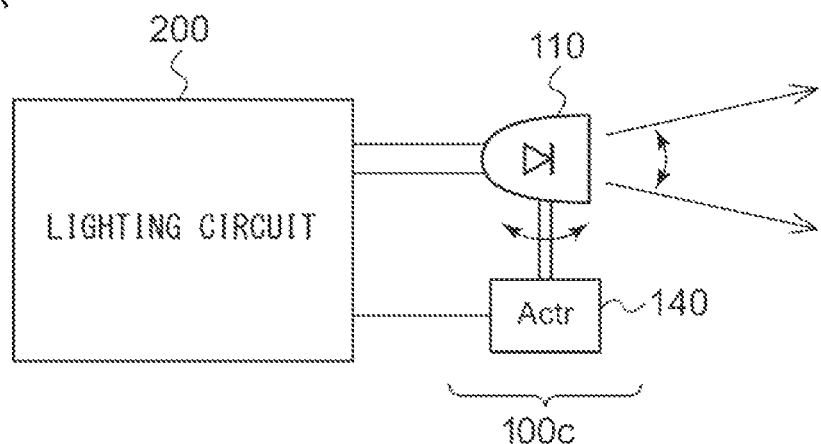
FIGS. 23A and 23B are block diagrams each showing a lamp system provided with a scanning light source according to a modification.
Figure 23B:
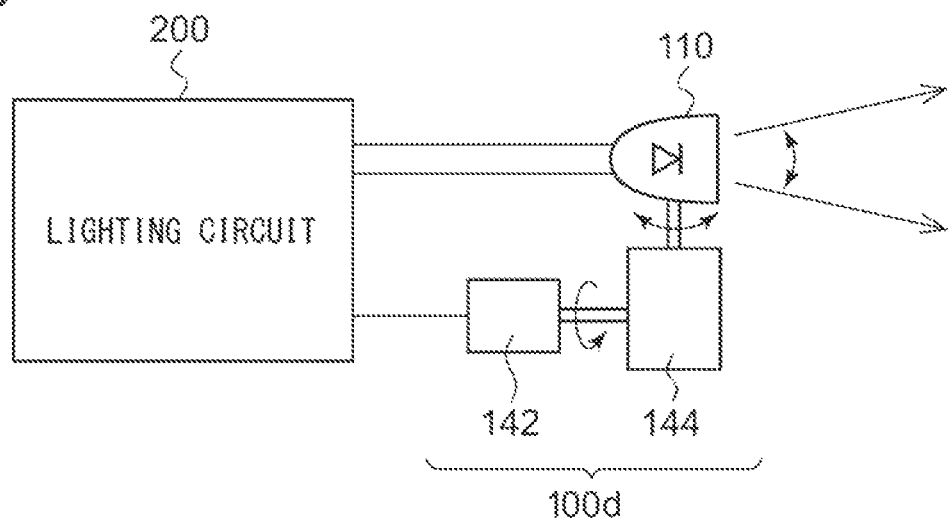

FIGS. 23A and 23B are block diagrams respectively showing lighting device systems including scanning light sources 100c and 100d according to a modification. In the scanning light source 100c shown in FIG. 23A, an actuator 140 is mounted on the semiconductor light source 110. The actuator 140 allows swiveling (or leveling) of the optical axis of the semiconductor light source 110.

The scanning light source 100d shown in FIG. 23B includes a motor 142 and a conversion apparatus 144 instead of the actuator 140. The conversion apparatus 144 receives the rotation of the motor 142 as its input, converts the rotational movement into reciprocal movement, and outputs the reciprocal movement. By applying the reciprocal movement output from the conversion apparatus 144 to the semiconductor light source 110, this allows the optical axis of the semiconductor light source 110 to be swiveled.

Description has been made regarding the present invention with reference to the embodiments using specific terms. However, the above-described embodiments show only an aspect of the mechanisms and applications of the present invention. Rather, various modifications and various changes in the layout can be made without departing from the spirit and scope of the present invention defined in appended claims.

What is claimed is:

1. An automotive lamp comprising:
    a scanning light source comprising a semiconductor light source and a motor, and structured to scan output light of the semiconductor light source in front of the lamp according to a movement of the motor; and
    a lighting circuit structured to measure a period of a pulse signal that is synchronized with the movement of the motor, to calculate a parameter based on a measurement value of the period and light distribution instruction data, to generate a dimming signal for indicating a time waveform of a light amount to be output from the semiconductor light source using the parameter, and to turn on the semiconductor light source according to the dimming signal,
    wherein, in the lighting circuit, a judgement condition is defined with respect to a current value that is the measurement value of the period in a current cycle and a reference value that is a period that was used to calculate the parameter in an immediately previous cycle,
    wherein, when pass judgement has been made for the judgment condition, the current value is used to calculate the parameter,
    and wherein, when fail judgement has been made for the judgment condition, instead of the current value, the reference value is used to calculate the parameter.

2. The automotive lamp according to claim 1, wherein, when a variation rate of the current value with respect to the reference value is within an allowable range, a pass judgement is made for the judgement condition.

3. The automotive lamp according to claim 1, wherein, during a period before a rotational speed of the motor becomes stable after a rotation of the motor is started, the current value is used to calculate the parameter.

4. The automotive lamp according to claim 3, wherein, after a rotation of the motor is started, the judgment condition is repeatedly judged,
    and wherein, when the pass judgement is consecutively obtained a predetermined number of times, judgment is made that the rotational speed of the motor has become stable.

5. The automotive lamp according to claim 1, wherein the motor is structured to be rotationally driven,
    and wherein the scanning light source further comprises a reflector mounted on the motor.

* * * * *